US006988053B2

(12) United States Patent
Namaky

(10) Patent No.: US 6,988,053 B2
(45) Date of Patent: Jan. 17, 2006

(54) COMBINED OFF-BOARD DEVICE AND STARTER/CHARGING/BATTERY SYSTEM TESTER

(75) Inventor: Hamid Namaky, South Russell, OH (US)

(73) Assignee: SPX Corporation, Charlotte, NC (US)

( * ) Notice: Subject to any disclaimer, the term of this patent is extended or adjusted under 35 U.S.C. 154(b) by 38 days.

(21) Appl. No.: 10/430,866

(22) Filed: May 7, 2003

(65) Prior Publication Data
US 2004/0054503 A1    Mar. 18, 2004

Related U.S. Application Data

(60) Provisional application No. 60/411,557, filed on Sep. 18, 2002.

(51) Int. Cl.
*G06F 15/00* (2006.01)
*G06F 7/00* (2006.01)
*G01M 17/00* (2006.01)

(52) U.S. Cl. ............ 702/183; 320/104; 324/73.1; 324/378; 324/426; 701/29; 701/33

(58) Field of Classification Search ........... 702/182, 702/183, 81–85, 127; 701/29, 33, 123; 324/73.1, 324/378, 426, 427, 430, 722; 320/104, 139; 174/52.1
See application file for complete search history.

(56) References Cited

U.S. PATENT DOCUMENTS

| 4,113,980 | A | 9/1978 | Bell |
| 4,125,894 | A | 11/1978 | Cashel et al. |
| 4,178,546 | A | 12/1979 | Hulls et al. |
| 4,423,378 | A | 12/1983 | Marino et al. |
| 4,540,929 | A * | 9/1985 | Binkley ............... 320/104 |
| 4,926,330 | A | 5/1990 | Abe et al. |
| 4,967,143 | A * | 10/1990 | Raviglione et al. ........ 324/73.1 |
| 5,107,425 | A | 4/1992 | Donges et al. |
| 5,281,919 | A | 1/1994 | Palanisamy |
| 5,459,660 | A | 10/1995 | Berra |
| 5,541,840 | A | 7/1996 | Gurne et al. |
| 5,649,001 | A | 7/1997 | Thomas et al. |
| 6,072,300 | A | 6/2000 | Tsuji |
| 6,094,609 | A * | 7/2000 | Arjomand ................. 701/29 |
| 6,172,505 | B1 | 1/2001 | Bertness |
| 6,181,992 | B1 | 1/2001 | Gurne et al. |
| 6,351,102 | B1 | 2/2002 | Troy |
| 6,553,290 | B1 * | 4/2003 | Pillar .................... 701/33 |
| 6,566,883 | B1 * | 5/2003 | Vonderhaar et al. ....... 324/426 |
| 6,570,385 | B1 * | 5/2003 | Roberts et al. ........... 324/378 |
| 6,586,941 | B2 | 7/2003 | Bertness et al. |
| 2002/0003423 | A1 | 1/2002 | Bertness et al. |

* cited by examiner

*Primary Examiner*—Michael Nghiem
*Assistant Examiner*—John Le
(74) *Attorney, Agent, or Firm*—Baker & Hostetler LLP

(57) ABSTRACT

The present invention is directed toward a hand-held "off-board" device, such as a scan tool or code reader, having a test circuit in the same housing that tests the condition of a starter charging system. Such a tester of the present invention allows a user to purchase and maintain a single device that can perform the desired diagnostic tests that are currently being performed by the separate devices.

26 Claims, 21 Drawing Sheets

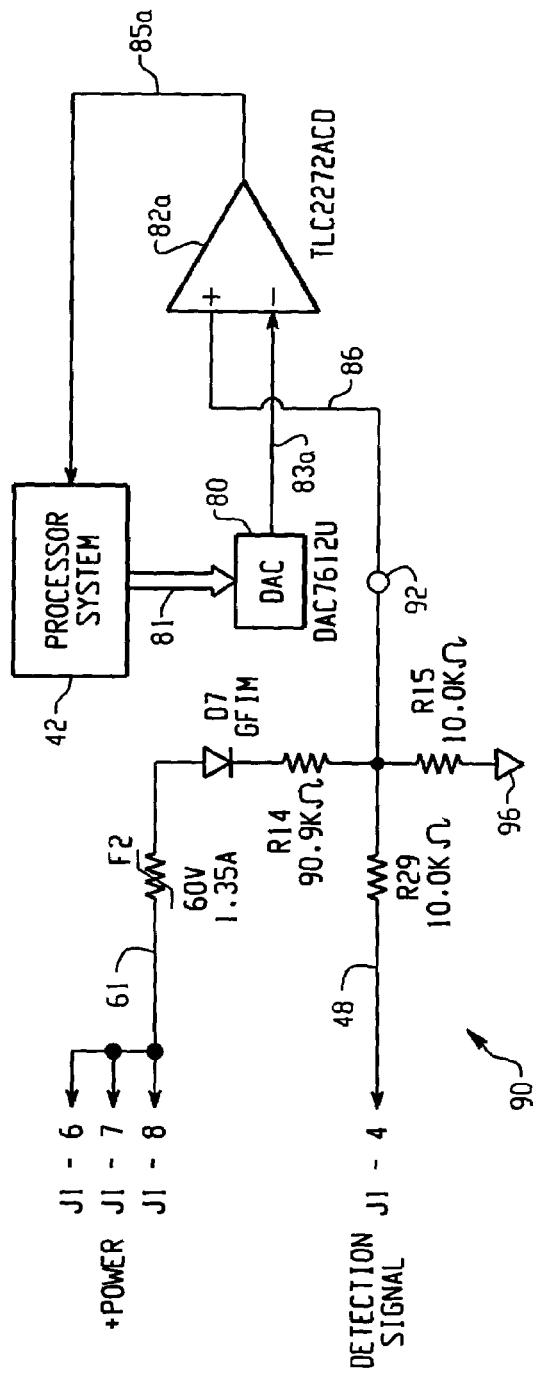
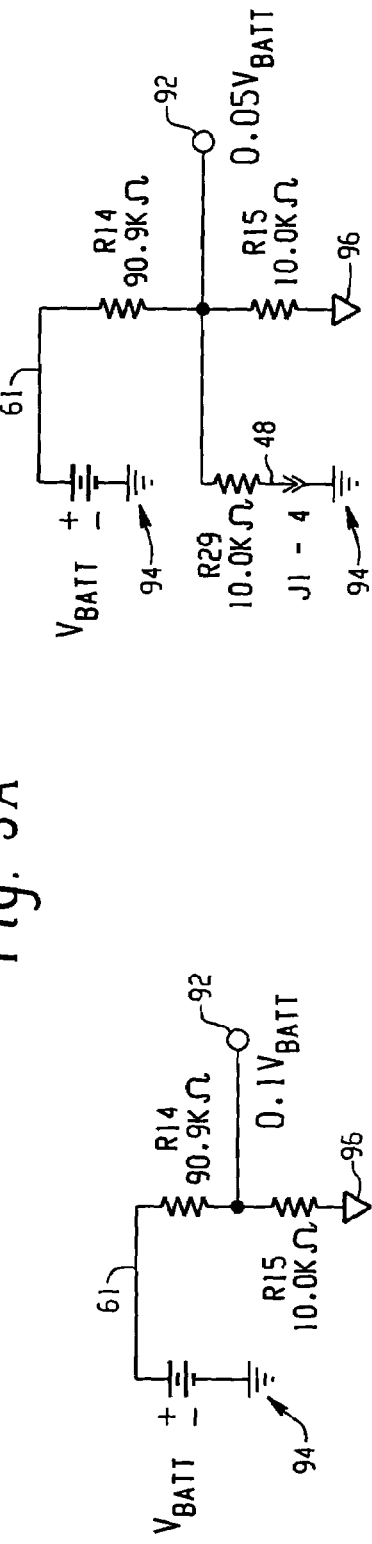
Fig. 3A
Fig. 3B
Fig. 3C

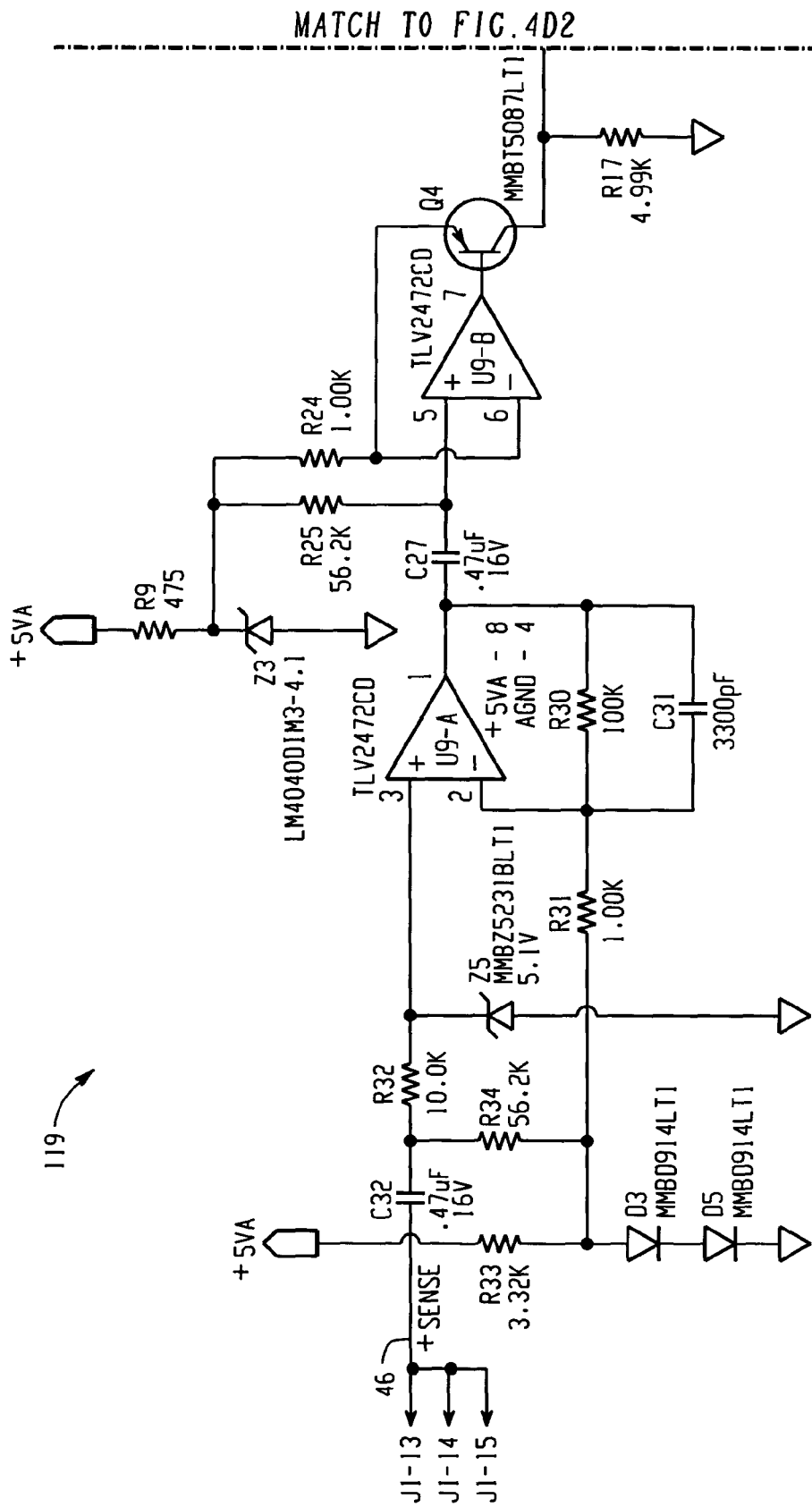
Fig. 4D1

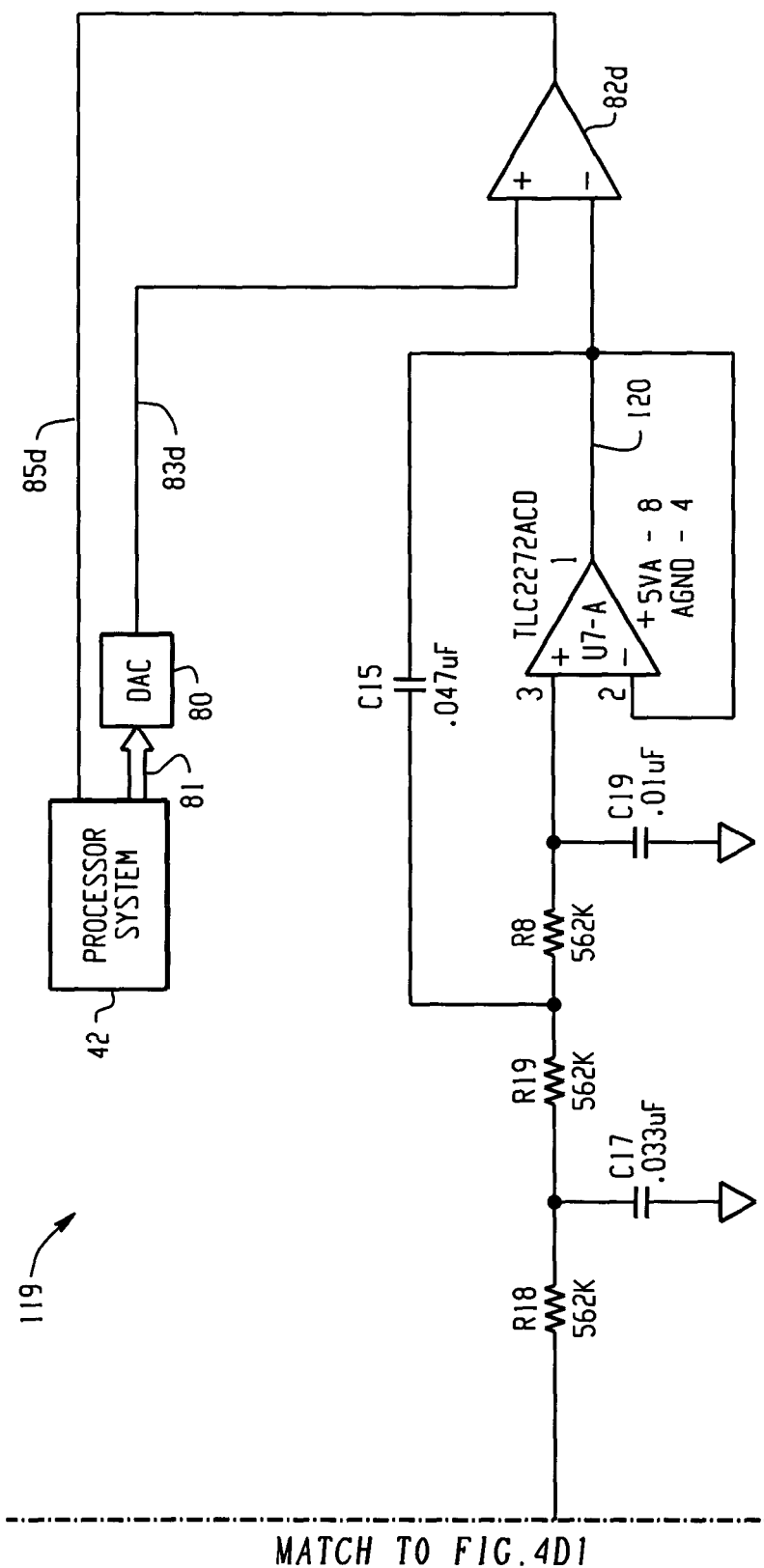
Fig. 4D2

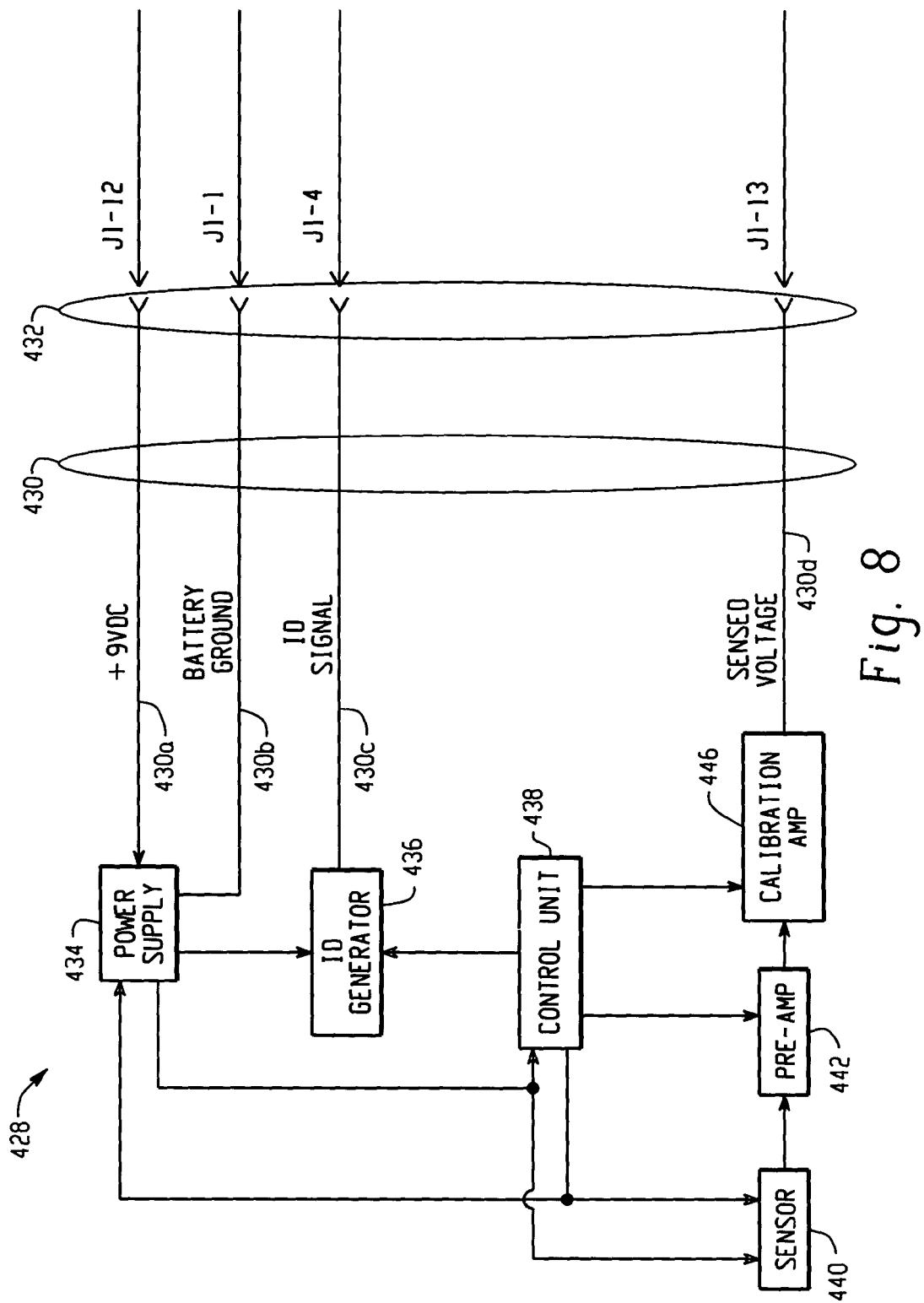

COMBINED OFF-BOARD DEVICE AND STARTER/CHARGING/BATTERY SYSTEM TESTER

CROSS-REFERENCE TO RELATED APPLICATIONS

This application claims priority to U.S. Provisional Application No. 60/411,557 filed on Sep. 18, 2002, which is hereby incorporated by reference in its entirety.

FIELD OF THE INVENTION

The following pertains generally to electrical testing equipment, and more particularly, to a hand-held "off-board device" (such as a scan tool or a code reader) having a test circuit to test the starting/charging system of an internal combustion engine of a vehicle, preferably having an electrical storage device, such as a battery.

BACKGROUND OF THE INVENTION

Modern vehicles typically have a vehicle diagnostic system, including one or more separate computer control modules. Examples of such computer control modules (also known as just "modules") are: a powertrain control module (PCM), an engine control module (ECM), a transmission control module (TCM), an ABS control module, and an air bag control module.

"Off-board devices," such as scan tools and code readers are known in the art. Scan tool and code reader testing devices that interface with vehicle diagnostic systems to, e.g., access, display, and/or print vehicle diagnostic information. OBD II (On-Board Diagnostics version II) Scan Tools are one commonly known type of scan tool and are governed by a number of standards, e.g., SAE J1978 Rev. 1998-02 and SAE J1979 Rev. 1997-09. Scan tools are relatively expensive diagnostic devices that have a relatively large number of features and are typically marketed to professional automobile mechanics and service stations. Scan tools are generally considered to be beyond the means of most automobile hobbyists and the ordinary individual interested in performing simple maintenance or service of a few vehicles, such as a family "fleet" of vehicles.

There are different types of scan tools. An "OBD II Scan Tool" complies with the above-identified specifications. By contrast, a "Manufacturer-Specific Scan Tool" is a scan tool that accesses and displays proprietary manufacturer-specific data (and possibly also additionally accesses and displays OBD II data). Examples include Device Controls on General Motors, On-Demand Tests in Ford, Actuator Tests, Sensor Tests, Interrogator, and Read Temporary Codes in Chrysler. In general, air bag data, ABS data, cruise control data, and climate control data are also considered to be proprietary manufacturer-specific data and are typically included only in Manufacturer-Specific Scan Tools.

An "off-board device" that is a low-cost alternative to the scan tool is a "code reader." In 1998 Actron Manufacturing Corp., the assignee of the present invention, pioneered the first OBD II code reader. In contrast with a scan tool, a code reader is a relatively basic "off-board device" that links with one or more computer modules in a vehicle diagnostic system via a vehicle computer network, reads any diagnostic trouble codes (also referred to as just "diagnostic codes" herein) asserted by those vehicle diagnostic systems, and displays any diagnostic codes on a display. Typical code readers do not perform the following major functions that are performed by typical scan tools: "View Data," also known as "Live Data," "Data," and "Data Test, DTC" (viewing and displaying in real-time live, changing data from a plurality of module sensors), display of textual diagnosis descriptions corresponding to the various diagnostic codes, recording and playback of data, device control (manually controlling modules for diagnostic purposes), and reading and displaying vehicle information from the vehicle's computer (e.g., VIN information, controller calibration identification number, etc.). Code readers are typically marketed to automobile hobbyists and non-professionals who are merely curious about what codes the various vehicle diagnostic systems have stored in their memories.

Off-board devices typically do not comprise test circuits. Rather off-board devices, such as scan tools and code readers, typically communicate with the vehicle diagnostic system, which does typically comprise one or more test circuits. Thus, typical off-board devices do not perform any tests themselves; with few exceptions (e.g., the NGS scan tool with its harness tester, "sensor simulation"), off-board devices merely report the results of tests performed by test circuitry external to the off-board device.

Scan tools do typically provide an indication of battery voltage, but do not provide information about the condition of a battery, i.e., scan tools typically do not provide any information about the ability of a battery to accept a charge. Thus, in addition to performing vehicle diagnostics using a scan tool or code reader, repair technicians typically also have one or more battery testers used to determine whether the battery installed in the vehicle will take a charge, i.e., whether the battery is "good" or "bad." The health of a lead acid battery is related to the internal resistance of the battery. Large capacity batteries have low resistance. Small capacity batteries have higher resistance. The internal resistance of a battery has two components. One is purely resistive (from ohmic contacts, connections and the like). The other is a result of the electrolyte resistance. Deterioration of the electrolyte chemistry as the battery ages results in an increase in internal resistance. Thus one may analyze the internal resistance of a battery and compare that to a rated value to determine the condition of the battery.

Battery testers typically determine the condition of batteries, e.g., determine the internal resistance of a battery, by either a load test or a small-signal analysis of the internal resistance of the battery. For a classic load test, a very high-current load is applied to the battery for a specified time and battery voltage is measured thereafter. Dougherty U.S. Pat. No. 5,773,977 teaches a tester that uses a bounce-back voltage after a load is removed to determine the condition of the battery. An example of a load tester is the well-known SUN VAT 40 load tester. Small-signal battery testers determine the condition of a battery by imposing a relatively low current (e.g., on the order of about an amp) AC signal across the terminals of the battery and analyzing the small AC voltage generated as a result of the internal resistance of the battery, e.g., by comparing a value related to battery internal resistance or conductance or impedance or admittance to a threshold value that is a function of the rated CCA value of the battery. Examples of the literally hundreds of patents showing small-signal battery testers include the testers shown in Furuishi U.S. Pat. No. 3,753,094, Bosch DE 29 26 716 B1, Marino U.S. Pat. No. 4,423,378, Champlin U.S. Pat. Nos. 3,873,911, 3,909,708, 4,912,416, 5,572,136, and 5,585, 728, Namaky U.S. Pat. No. 6,384,608 B1, and Cervas U.S. Pat. No. 6,388,488. The testers in Frailing U.S. Pat. No. 4,193,025 and Dougherty, et al. U.S. Pat. No. 6,144,185 are examples of testers that use both (i) one or more load tests and (ii) one or more small signal tests to determine battery condition. All of the foregoing patents are incorporated herein by reference. Various small signal battery testers have been sold by Actron Manufacturing Co., Robert Bosch GmbH, and others.

Two additional factors are typically accounted for when determining the condition of a battery with a small-signal tester: temperature and state-of-charge. First, the internal resistance will increase if the battery is not fully charged (because the electrolyte is lacking conductive ions). Secondly, cold temperatures increase the resistance of the battery (because of electrolyte chemistry).

To properly diagnose problems with today's modern automobiles most technicians and casually users need to purchase both an "off-board" device and a separate starter/charger/battery tester.

SUMMARY OF THE INVENTION

The present invention is directed toward a hand-held "off-board" device, such as a scan tool or code reader, having a test circuit in the same housing that tests the condition of a starter charging system. Such a tester of the present invention allows a user to purchase and maintain a single device that can perform the desired diagnostic tests that are currently being performed by the separate devices.

It is therefore an advantage of the present invention to provide a portable handheld tester for a vehicle that functions as both an "off-board device" and a starter/charging system tester.

This and other advantages of the present invention will become more apparent from a detailed description of the invention.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to example the principles of this invention, wherein:

FIG. 3A is a schematic block diagram showing more detail about one implementation of a detection circuit of the starting/charging system tester according to the present invention;

FIGS. 3B–3F are schematic diagrams showing equivalent circuits of a portion of the detection circuit of FIG. 3A showing the detection circuit of FIG. 3A in various use configurations;

FIG. 4D is a schematic diagram illustrating the an AC voltage amplifier/converter circuit of the battery tester component of the present invention;

FIG. 8 is a block diagram of a sensor cable, e.g., a current probe, for the starting/charging system tester according to the present invention;

DETAILED DESCRIPTION OF THE DRAWINGS

Figure 1A:
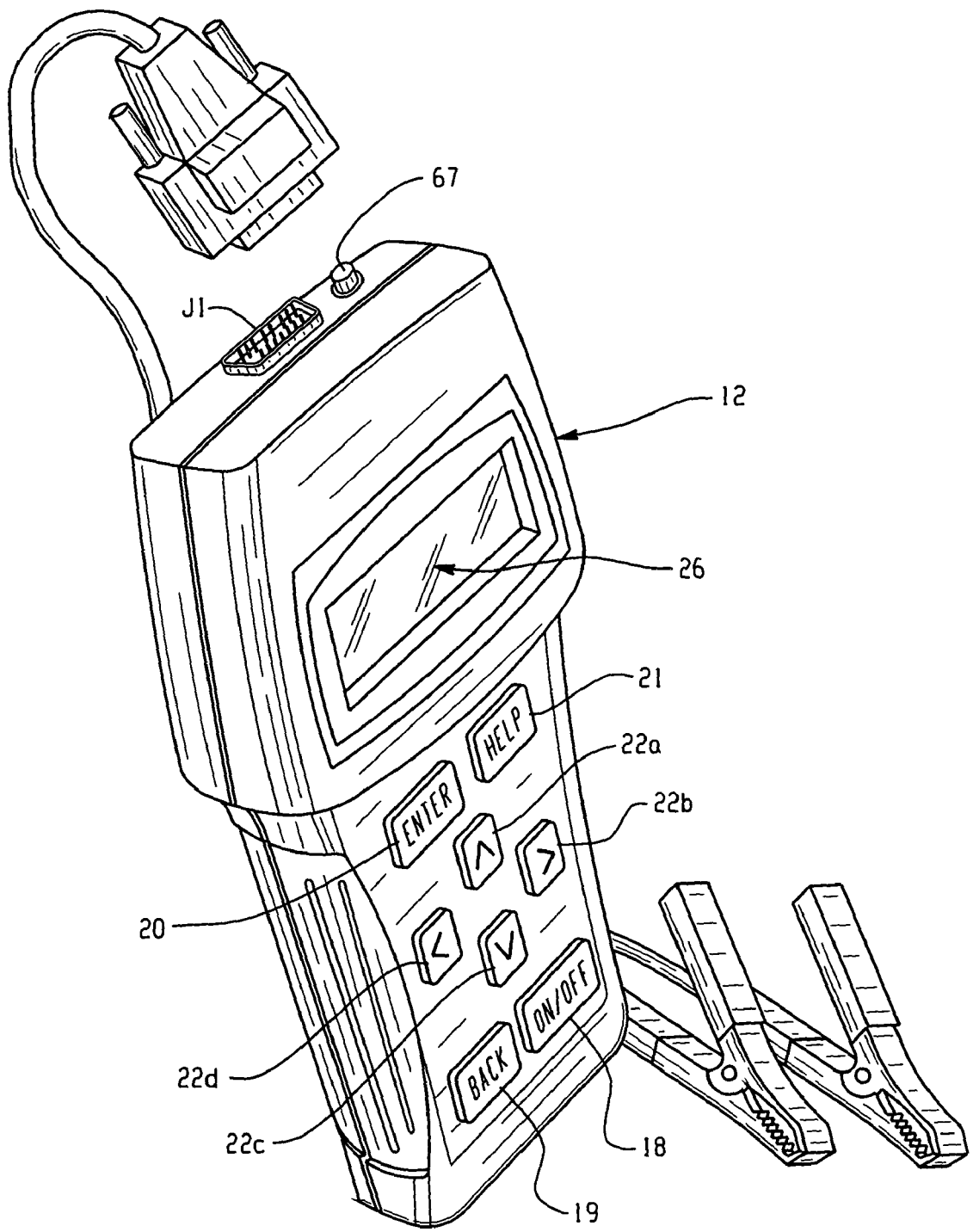
FIG. 1A is an isometric view of an embodiment of the starting/charging system tester according to the present invention.

Referring to FIGS. 1A–1D, there is shown a handheld, portable tester 10 according to the present invention for selectively implementing a tester to test a vehicle starting/charging system 11 or an off-board device (e.g., a scan tool or a code reader) to interface to a vehicle's diagnostic system 13, e.g., selectively implementing a code reader or a battery tester or selectively implementing a scan tool or a tester for starter/charger/battery tests. The tester 10 comprises a handheld, portable enclosure 12 housing an electronic circuit 14 that, among other things, implements the communications link to communicate with the diagnostic system 13 and tests one or more portions of the starting/charging system 11, e.g., the battery, the starter, and the charger. One or more user inputs 16, shown in FIG. 1A as momentary switches implementing an "on/off" key 18, a "back" key 19, an "enter" key 20, a "help" key 21, and four "arrow" keys 21a–22d, allow a user to interface with the tester 10. Of course, other key combinations and permutations can be used, as can entirely different input devices. A display 24, shown in FIG. 1A as a liquid crystal display (LCD) 26 having four lines of twenty characters each, allows the tester 10 to display information to the user.

Figure 1B:
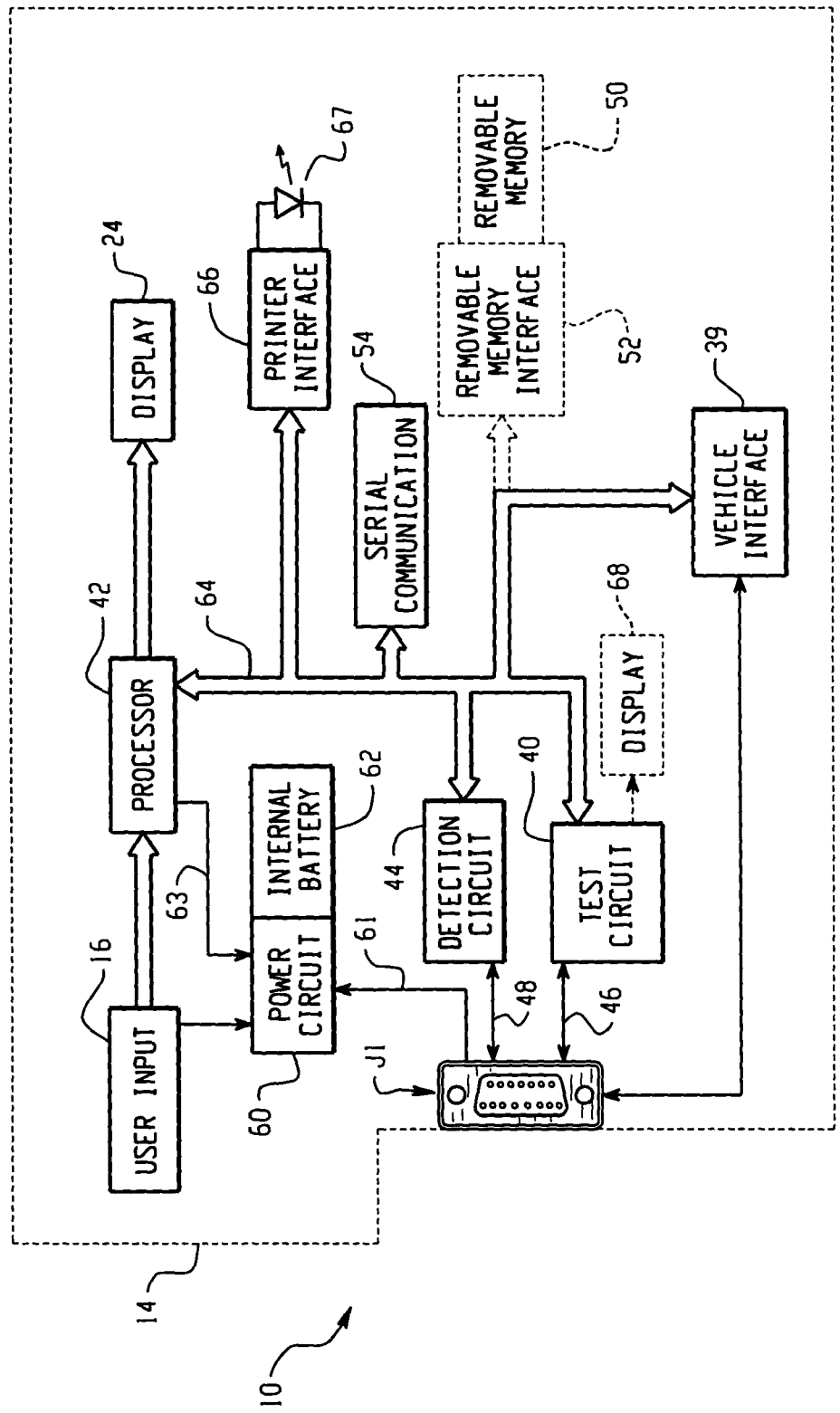
FIG. 1B is a high-level block diagram showing an embodiment of the starting/charging system tester according to the present invention.
Figure 1C:
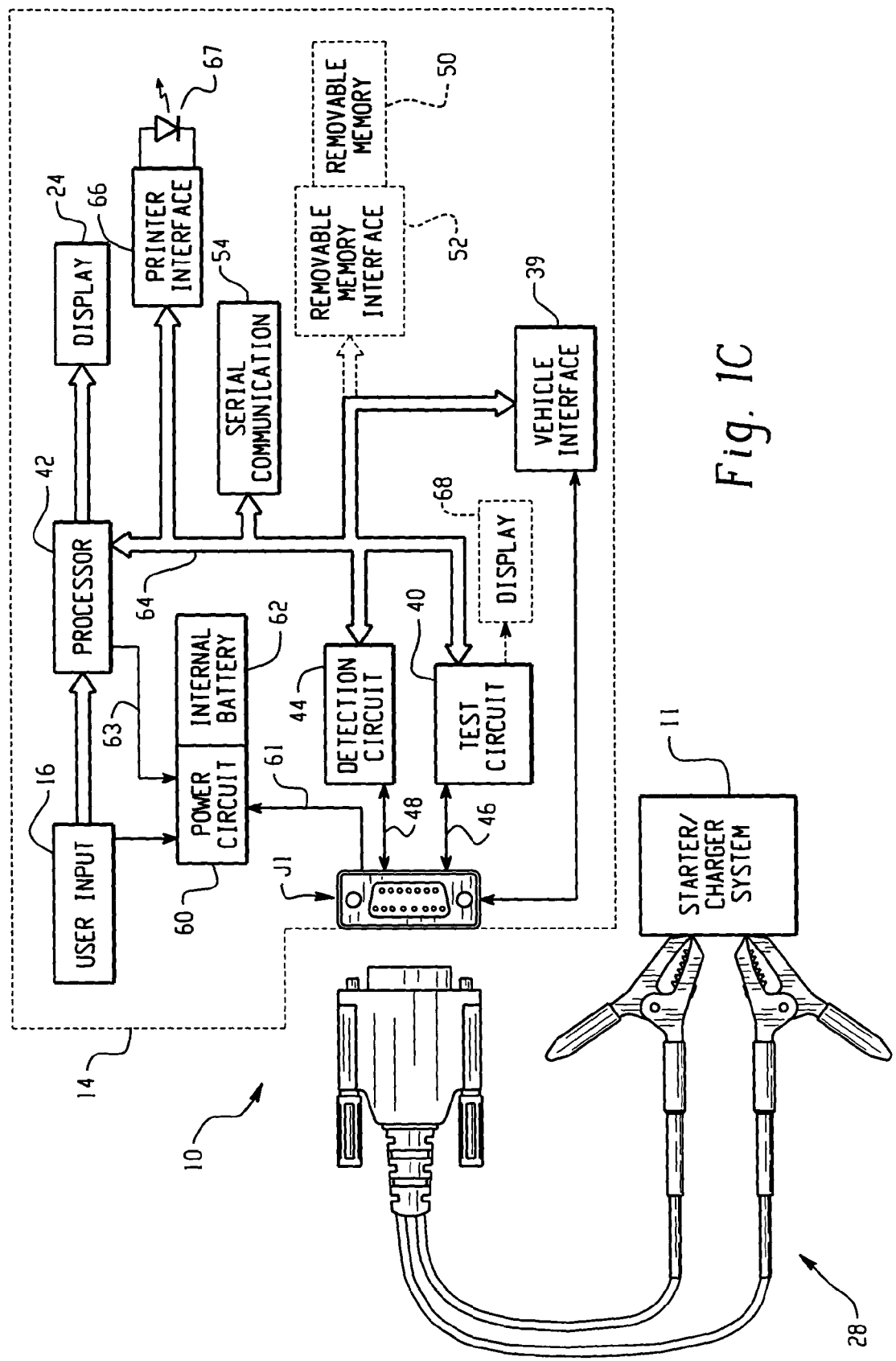
FIG. 1C is the high-level block diagram of FIG. 1B, with a battery test cable having a pair of battery clamps, preferably forming a Kelvin connection with the battery.
Figure 1D:
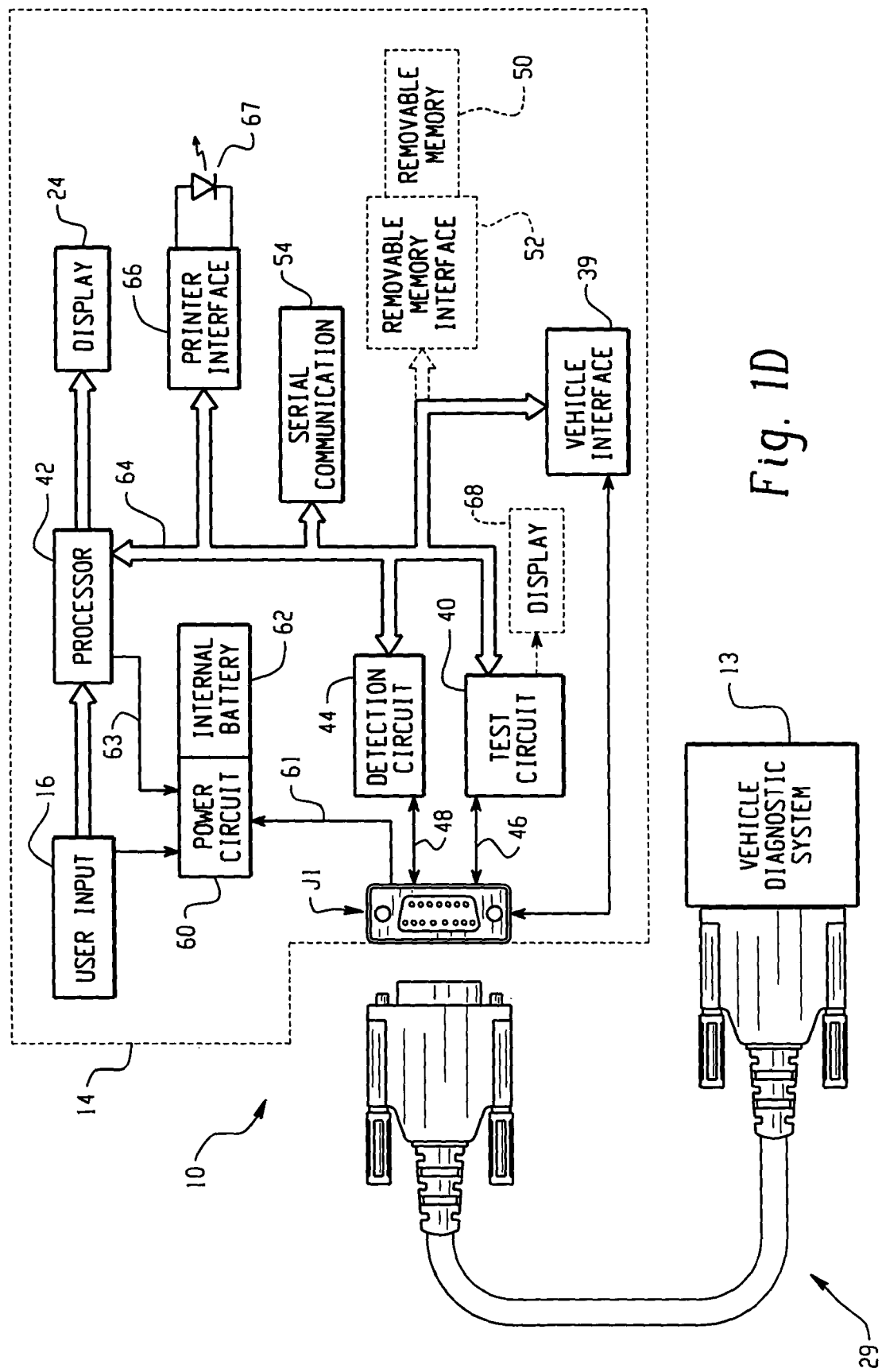
FIG. 1D is the high-level block diagram of FIG. 1B, with an off-board device data link connector ("DLC" a/k/a a diagnostic link connector) cable having a data link connector connected to the vehicle diagnostic system.

While in the battery tester mode, the tester 10 is placed in circuit communication with the starting/charging system 11 via a battery test cable 28 (FIG. 1C). While in the off-board device mode, the tester 10 is placed in circuit communication with the vehicle diagnostic system 13 via a DLC cable 29 (FIG. 1D). "Circuit communication" as used herein indicates a communicative relationship between devices. Direct electrical, electromagnetic, and optical connections and indirect electrical, electromagnetic, and optical connections are examples of circuit communication. Two devices are in circuit communication if a signal from one is received by the other, regardless of whether the signal is modified by some other device. For example, two devices separated by one or more of the following—amplifiers, filters, transformers, optoisolators, digital or analog buffers, analog integrators, other electronic circuitry, fiber optic transceivers, or even satellites—are in circuit communication if a signal from one is communicated to the other, even though the signal is modified by the intermediate device(s). As another example, an electromagnetic sensor is in circuit communication with a signal if it receives electromagnetic radiation from the signal. As a final example, two devices not directly connected to each other, but both capable of interfacing with a third device, e.g., a CPU, are in circuit communication. Also, as used herein, voltages and values representing digitized voltages are considered to be equivalent for the purposes of this application and thus the term "voltage" as used herein refers to either a signal, or a value in a processor representing a signal, or a value in a processor determined from a value representing a signal. Additionally, the relationships between measured values and threshold values are not considered to be necessarily precise in the particular technology to which this disclosure relates. As an illustration, whether a measured voltage is "greater than" or "greater than or equal to" a particular threshold voltage is generally considered to be distinction without a difference in this area with respect to implementation of the tests herein. Accordingly, the relationship "greater than" as used herein shall encompass both "greater than" in the traditional sense and "greater than or equal to." Similarly, the relationship "less than" as used herein shall encompass both "less than" in the traditional sense and "less than or equal to." Thus, with A being a lower value than B, the phrase "between A and B" as used herein shall mean a range of values (i) greater than A (in the traditional sense) and less than B (in the traditional sense), (ii) greater than or equal to A and less than B (in the traditional sense), (iii) greater than A (in the traditional sense) and less than or equal to B, and (iv) greater than or equal to A and less than or equal to B. To avoid any potential confusion, the traditional use of these terms "greater than and "less than," to the extent that they are used at all thereafter herein, shall be referred to by "greater than and only greater than" and "less than and only less than," respectively.

The battery test cable 28 and the DLC cable 29 are preferably separate cables that independently connect to the tester 10. Preferably the tester 10 includes a connector J1, having a plurality of electrical connections, to which battery test cable 28 and DLC cable are both removably connected. Preferably, the connector J1 is configured so that only one of the battery test cable 28 or the DLC cable is connected at any given time. In the alternative, the connector J1 can be configured to accept both the battery test cable 28 and the DLC cable 29 at the same time, or separate connectors can be provided for removable connection. Also, in the alternative, the battery test cable 28 and the DLC cable 29 can be irremovably connected to the tester 10. Having the test cable 28 and the DLC cable 29 be removably connected to the tester 10 among other things (i) permits different test cables (cables of FIGS. 5A, 7A, and 8) to be used with a single tester thereby allowing a wider range of functions to be performed with the tester 10, (ii) permits an optional extender cable (cable of FIGS. 6A and 6B) to be used, thereby allowing the tester 10 to be used by one person sitting in a driver's seat for some tests, but allowing a shorter cable (FIG. 5A) to be used for others, and (iii) allows the tester 10 to be stored separately from the cables.

Referring more specifically to FIG. 1B, the tester 10 of the present invention preferably includes an electronic test circuit 14 that generates a communications link with the vehicle diagnostic system 13 and that tests the starting/charging system 11. This test circuit 14 preferably includes a vehicle interface unit 39 and a discrete test circuit 40 in circuit communication with an associated processor circuit 42. In the alternative, the test circuit 14 can consist of vehicle interface unit 39 in circuit communication with processor circuit 42 and discrete test circuit 40 not in circuit communication with the processor circuit 42. In either event, preferably, the tester 10 of the present invention also includes a detection circuit 44 in circuit communication with the test circuit 40 and/or the processor circuit 42. The test circuit 40 preferably accepts at least one test signal 46 from the starting/charging system 11 via the cable 28 and connector J1. The detection circuit 44 preferably accepts at least one detection signal 48 from the tester cable 28 or the DLC cable 29 or other device (e.g., sensor cable of FIG. 8) placed in circuit communication with the tester 10 via connector J1. Tester 10 also preferably includes a power circuit 60 allowing the tester 10 to be powered by either the starting/charging system 11 via power connection 61 or by an internal battery 62. In addition, one or more optional removable additional storage devices 50 can be placed in circuit communication with the processor 42 via optional removable memory interface 52 and can comprise, for example, cartridge memories (such as those containing EPROM, EEPROM, or Flash PROM memories), PC cards, stick memories (such as SONY brand MEMORY STICK packaged memory semiconductors), so-called floppy diskettes, etc. Additionally, the processor 42 is preferably in circuit communication with a serial communications circuit 54, e.g., a UART to generate an RS-232C protocol or a USB bridge, to allow the tester 10 to communicate with external devices.

The processor circuit 42, also referred to herein as just processor 42, may be one of virtually any number of processor systems and/or stand-alone processors, such as microprocessors, microcontrollers, and digital signal processors, and has associated therewith, either internally therein or externally in circuit communication therewith, associated RAM, ROM, EPROM, EEPROM, clocks, decoders, memory controllers, and/or interrupt controllers, etc. (all not shown) known to those in the art to be needed to implement a processor circuit. One suitable processor is the SAB-C501G-L24N microcontroller, which is manufactured by Siemens and available from various sources. The processor 42 is also preferably in circuit communication with various bus interface circuits (BICs) via its local bus 64, e.g., a printer interface 66, which is preferably an infrared interface, such as the known Hewlett Packard (HP) infrared printer protocol used by many standalone printers, such as model number 82240B from HP, and which communicates via infrared LED 67. The user input 16, e.g., keys 18–21 and 22a–22d, preferably interfaces to the tester 10 via processor 42. Likewise, the display 24 preferably is interfaced to the tester 10 via processor 42, with the processor 42 generating the information to be displayed on the display 24. In addition thereto, or in the alternative, the tester 10 may have a second display 68 (e.g., one or more discrete lamps or light emitting diodes or relays for actuation of remote communication devices) in circuit communication with the test circuit 40.

The processor 42 typically executes a computer program stored in its RAM, ROM, Flash memory, and/or its EPROM (all not shown) and/or stored in any of the additional removable storage devices 50, if any, using data stored in any one or more of those memories. For example, the processor 42 may execute a computer program from an EEPROM (not shown) using data (e.g., OBD II diagnostic codes or textual descriptions of diagnostic codes) stored in a cartridge memory. In general, the computer program executed by the processor 42 initializes the tester 10 and generates a user interface (e.g., using the input device(s) 18), through which a user either causes the tester 10 to test the battery (or another part of the starting/charging system) or causes the tester 10 to act as an off-board device, i.e., communicating with the vehicle computer network 13 to read certain data from the vehicle computer network 13, format such read data, and display the formatted data on the display 24.

The DLC communications circuit, vehicle interface 39, typically generates one or more communications protocols with which the tester 10 and the vehicle computer network 13 communicate with one-another. The communications circuit 39 can be implemented either in hardware, or in software, or in a combination of hardware and software. Vehicle interface 39 preferably generates a communications link consistent with any one or more of the following protocols: SAE J1850 (VPM), SAE J1850 (PWM), ISO 9141-2, ISO 14230-4 ("Keyword 2000"), and Controller Area Network ("CAN") (ISO 15765-4). The present invention is not intended to be limited to any specific protocol, or even to electrical communications protocols. Other present and future protocols, such as fiber optic and wireless communications protocols, are also contemplated as being within the scope of the present invention.

Figure 2:
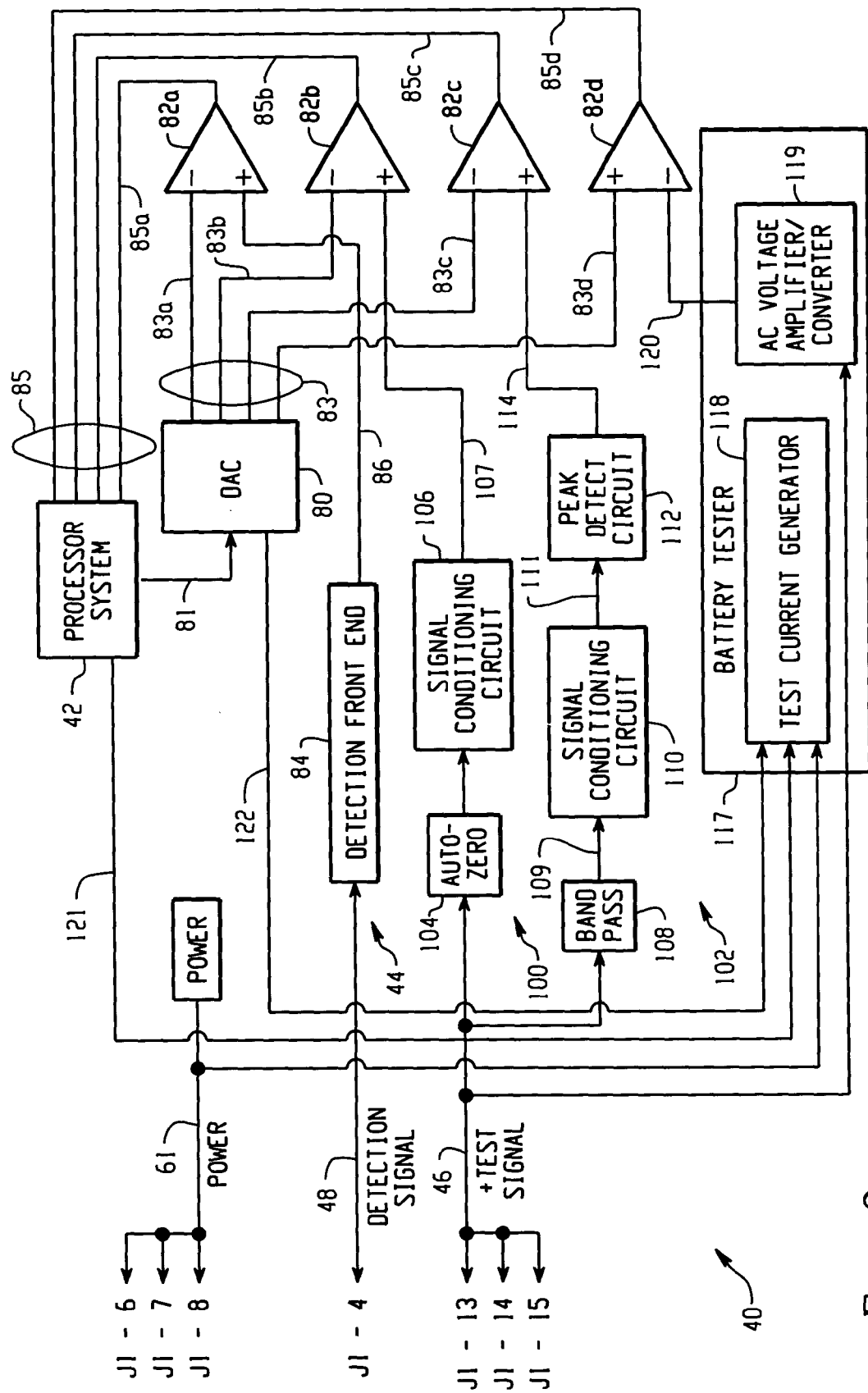
FIG. 2 is a medium-level block diagram showing a detection circuit and a test circuit of an embodiment of the starting/charging system tester according to the present invention.

Referring now to FIG. 2, a more detailed block diagram showing an exemplary implementation of the test circuit 40 and detection circuit 44 is shown. In the particular implementation of FIG. 2, the test circuit 40 and detection circuit 44 are implemented using a digital-to-analog converter (DAC) 80 that is in circuit communication with processor 42 via bus 81 and in circuit communication with a number of comparators 82 via reference voltage outputs 83, which comparators 82 in turn are in circuit communication with the processor 42 via test signals 85. Although the test circuit 40 and detection circuit 44 need not be so implemented, having at least a portion of the test circuit 40 be implemented using a DAC 80 and a comparator 82 in circuit communication with the processor 42 provides certain benefits, as explained below.

The detection circuit 44 preferably includes a detection front end 84 and a comparator 82*a*. The detection front end 84 preferably accepts as an input the detection signal 48 and generates an output 86 to the comparator 82*a*. Referring to FIG. 3A, a circuit implementation of the detection circuit 44 is shown schematically. The preferred implementation of the detection front end 84 is shown as circuitry 90 to the left of node 92. The circuitry shown includes a connection J1-6, J1-7, J1-8 to the battery of the starting/charging system 11, a PTC F2 (positive temperature coefficient device that acts as a sort of automatically resetting fuse), a diode D7, a voltage divider created by resistors R14 and R15, and a connection to detection signal 48 at J1-4 via resistor R29. The component values are preferably substantially as shown. Processor 42, via bus 81, causes DAC 80 to generate a particular voltage on reference voltage line 83*a*, which is input to comparator 82*a*. The detection front end 90 generates a particular detection voltage at node 92, depending on what signals are presented at power signal 61 and detection signal 48. The comparator 82*a* will output a logical ONE or a logical ZERO to processor 42 depending on the relative values of the reference voltage 83*a* and the detection voltage at node 92. Thus, to detect which cable 28 or device is attached to connector J1, the processor 42 need only send a command to DAC 80 via bus 81, wait a period of time for the various voltages to stabilize, and read a binary input from input 85*a*.

Figure 3E:
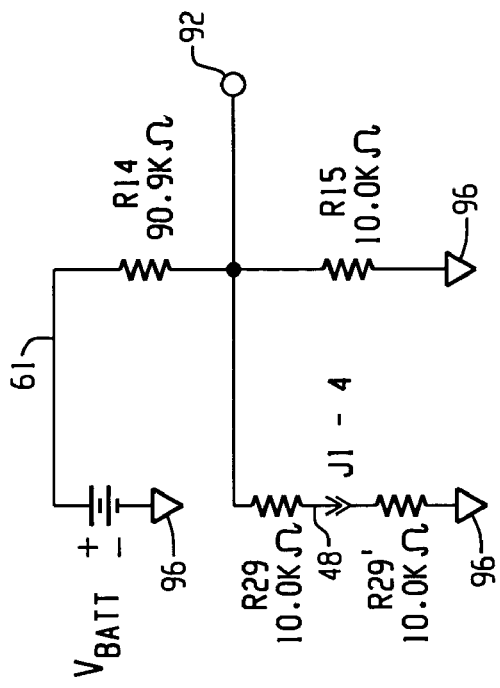
Figure 3F:
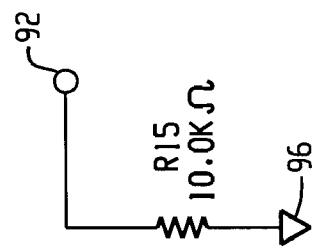
Figure 3D:
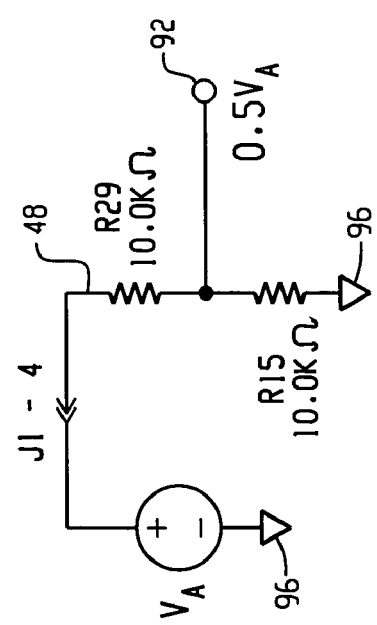

Various connection scenarios for detection front end circuitry 90 are shown in FIGS. 3B–3F, which correspond to various test cables 28 and other signals connected to connector J1. In each, the voltage at node 92 is determined using straightforward, known resistor equations, e.g., resistor voltage divider equations, equivalent resistances for resistors in series, and equivalent resistance for resistors in parallel, etc. In FIG. 3B, the power signal 61 is connected to the battery, which presents a battery voltage $V_{BATT}$, and the detection signal 48 (shown in FIG. 3A) is left as an open circuit; therefore, the test voltage at node 92 is approximately $0.1 \cdot V_{BATT}$, because the battery voltage $V_{BATT}$ is divided by resistors R14 (90.9 KΩ) and R15 (10.0 KΩ). In FIG. 3C, the power signal 61 is connected to the battery, which presents a battery voltage $V_{BATT}$, and the detection signal 48 is grounded to the battery ground; therefore, the test voltage at node 92 is approximately $0.05 \cdot V_{BATT}$, because in this scenario the battery voltage is divided by R14 (90.9 KΩ) and the combination of R15 (10.0 KΩ) and R29 (10.0 KΩ) in parallel (5.0 KΩ combined resistance). In FIG. 3D, the power signal 61 (shown in FIG. 3A) is left as an open circuit, and the detection signal 48 is connected to an applied voltage $V_A$; therefore, the test voltage at node 92 is $½V_A$, because the applied voltage $V_A$ is divided equally by resistors R29 (10.0 KΩ) and R15 (10.0 KΩ). In FIG. 3E, the power signal 61 is connected to the battery, which presents a battery voltage $V_{BATT}$, and the detection signal 48 is grounded to the battery ground via an additional resistor R29'; therefore, the test voltage at node 92 is the following function of $V_{BATT}$, $$V_{92} = \frac{Req}{Req + R_{14}} \cdot V_{BATT}$$

where $$Req = \frac{1}{\frac{1}{R15} + \frac{1}{R29 + R29'}}$$

because in this scenario the battery voltage is divided by R14 and the combination of R15 in parallel with R29 and R29' in series, which is about $0.07 \cdot V_{BATT}$ if R29' is 10.0 KΩ. Finally, in FIG. 3F, the power signal 61 (shown in FIG. 3A) is open circuit and the detection signal 48 (shown in FIG. 3A) is open circuit; therefore, the voltage at node 92 is pulled to ground by resistor R15. In all these scenarios, power ground 94 is preferably connected to signal ground 96 either at the negative battery terminal or within test cable 28. The processor 42, DAC 80, and comparator 82*a* preferably use the known successive approximation method to measure the voltage generated by the detection circuit front end 84. In the alternative, an analog-to-digital converter can be used to measure the voltage generated by the detection circuit front end 84.

Thus, in the general context of FIGS. 1A, 1B, 2, and 3A–3F, a specific test cable 28 connected to connector J1 will cause the voltage 86 (i.e., the voltage at node 92) to be a specific voltage, which is measured using the exemplary successive approximation method. The processor 42 then preferably determines from that voltage 86 which cable 28 is connected to the tester at connector J1 and executes appropriate code corresponding to the particular cable 28 connected to the connector J1. Various specific connectors 28 are described below in connection with FIGS. 5A–5C, 6A–6B, 7A–7C, and 8.

Referring back to FIG. 2, the test circuit 40 preferably includes a voltmeter circuit 100 and a diode ripple circuit 102. The voltmeter circuit 100 is preferably implemented using a DAC 80 and comparator 82b, to facilitate testing the starting portion of the starting/charging system 11. In the preferred embodiment, the voltmeter circuit 100 comprises an autozero circuit 104 in circuit communication with a signal conditioning circuit 106. The autozero circuit 104 preferably accepts as an input the test signal 46. The signal conditioning circuit 106 generates a test voltage 107 that is compared to a reference voltage 83b by comparator 82b, which generates test output 85b. Similarly, the diode ripple circuit 102 is preferably implemented using a DAC 80 and comparator 82c. In the preferred embodiment, the diode ripple circuit 102 comprises a bandpass filter 108 in circuit communication with a signal conditioning circuit 110, which in turn is in circuit communication with a peak detect circuit 112. The diode ripple circuit 102 accepts as an input the test signal 46. The peak detect circuit 112 generates a test voltage 114 that is compared to a reference voltage 83c by comparator 82c, which generates test output 85c.

Figure 4A:
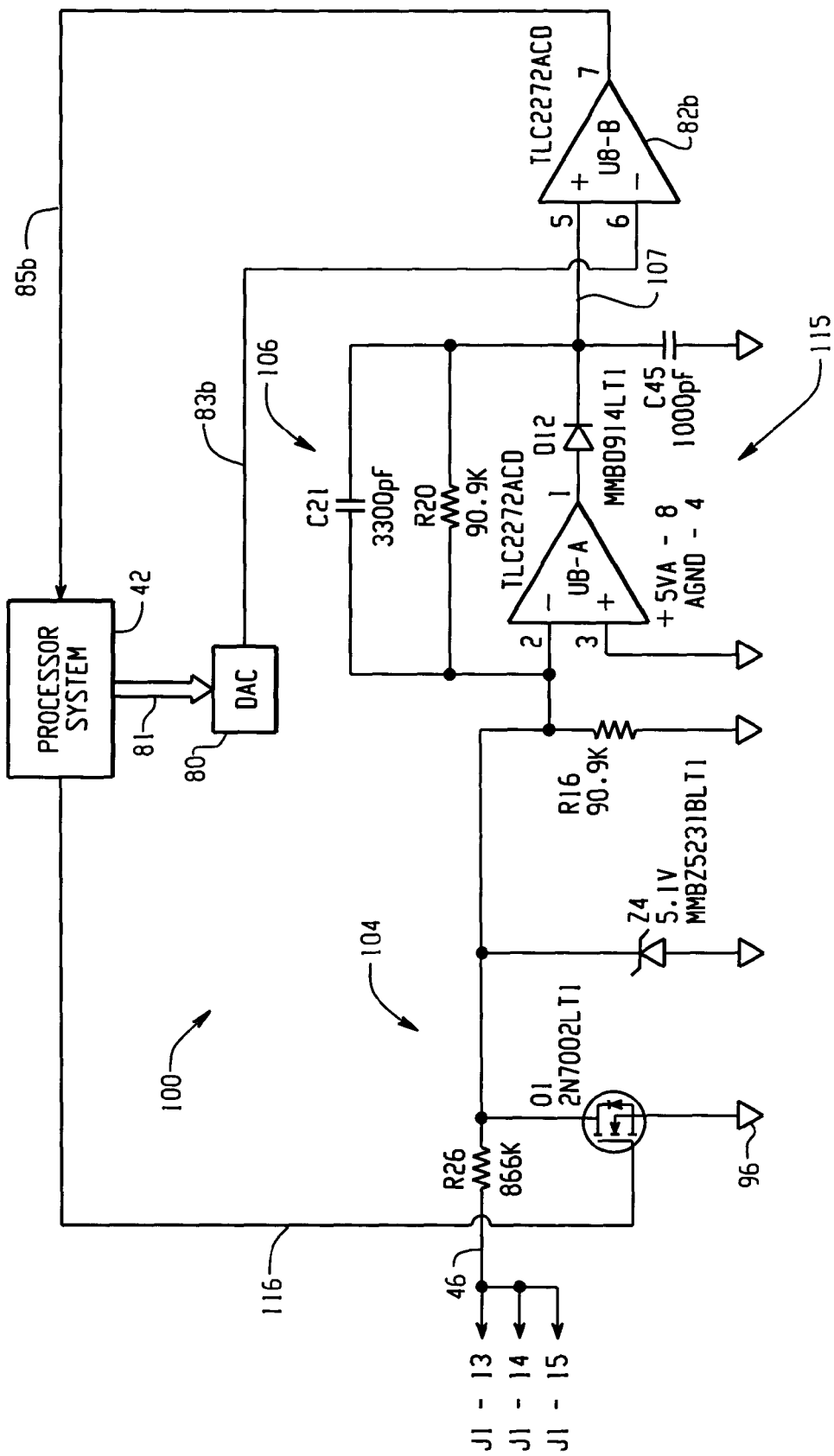
FIG. 4A is a schematic block diagram showing more detail about one implementation of a voltmeter test circuit of the starting/charging system tester according to the present invention.

Referring now to FIG. 4A, a schematic block diagram of a preferred embodiment of the voltmeter circuit 100 is shown. The signal conditioning circuit 106 preferably comprises a protective Zener diode Z4 and amplifier circuit 115. Amplifier circuit 115 preferably comprises an operational amplifier U8-A and associated components resistor R16, resistor R20, capacitor C21, capacitor C45, and diode D12, connected in circuit communication as shown. Amplifier circuit 115 generates test signal 107 as an input to comparator 82b. The processor 42, DAC 80, amplifier circuit 115, and comparator 82b preferably use the known successive approximation method to measure the voltage input to the amplifier 115, which is either the signal 46 or a ground signal generated by the autozero circuit 104 responsive to the processor 42 activating transistor Q1. After using the successive approximation method, the processor 42 has determined a value corresponding to and preferably representing the voltage at 46. The autozero circuit 104 preferably comprises a transistor Q1 in circuit communication with processor 42 via an autozero control signal 116. Ordinarily, the signal 46 from cable 28 passes through resistor R26 to amplifier 115. However, responsive to the processor 42 asserting a logical HIGH voltage (approximately 5 VDC) onto the autozero control signal 116, transistor Q1 conducts, causing the signal 46 to be pulled to signal ground 96 through resistor R26. As known to those in the art, the voltage measured at signal 107 while the autozero control signal 116 is asserted is used as an offset for voltage measurements taken with voltmeter 100 and is used to offset the value corresponding to and preferably representing the voltage at 46.

Having the voltmeter 100 be implemented in this manner, i.e., with a processor, a DAC, and a comparator, provides several benefits. One benefit is reduced cost associated with not having to have a discrete analog-to-digital converter in the circuit. Another benefit is demonstrated during the test of the starting portion of the starting/charging system 11. In that test, the test circuit 40 waits for the battery voltage to drop to a predetermined threshold value, which indicates that a user has turned the key to start the starter motor. The voltage drops very rapidly because the starter motor presents almost a short circuit to the battery before it begins to rotate. The particular implementation of FIG. 4A facilitates the process of detecting the voltage drop by permitting the processor 42 to set the threshold voltage in the DAC 80 once and then continuously read the input port associated with input 85b from comparator 82b. As the battery voltage drops to the threshold voltage set in DAC 80, the output comparator almost instantaneously changes, indicating to processor 42 that the voltage drop has occurred.

Figure 4B:
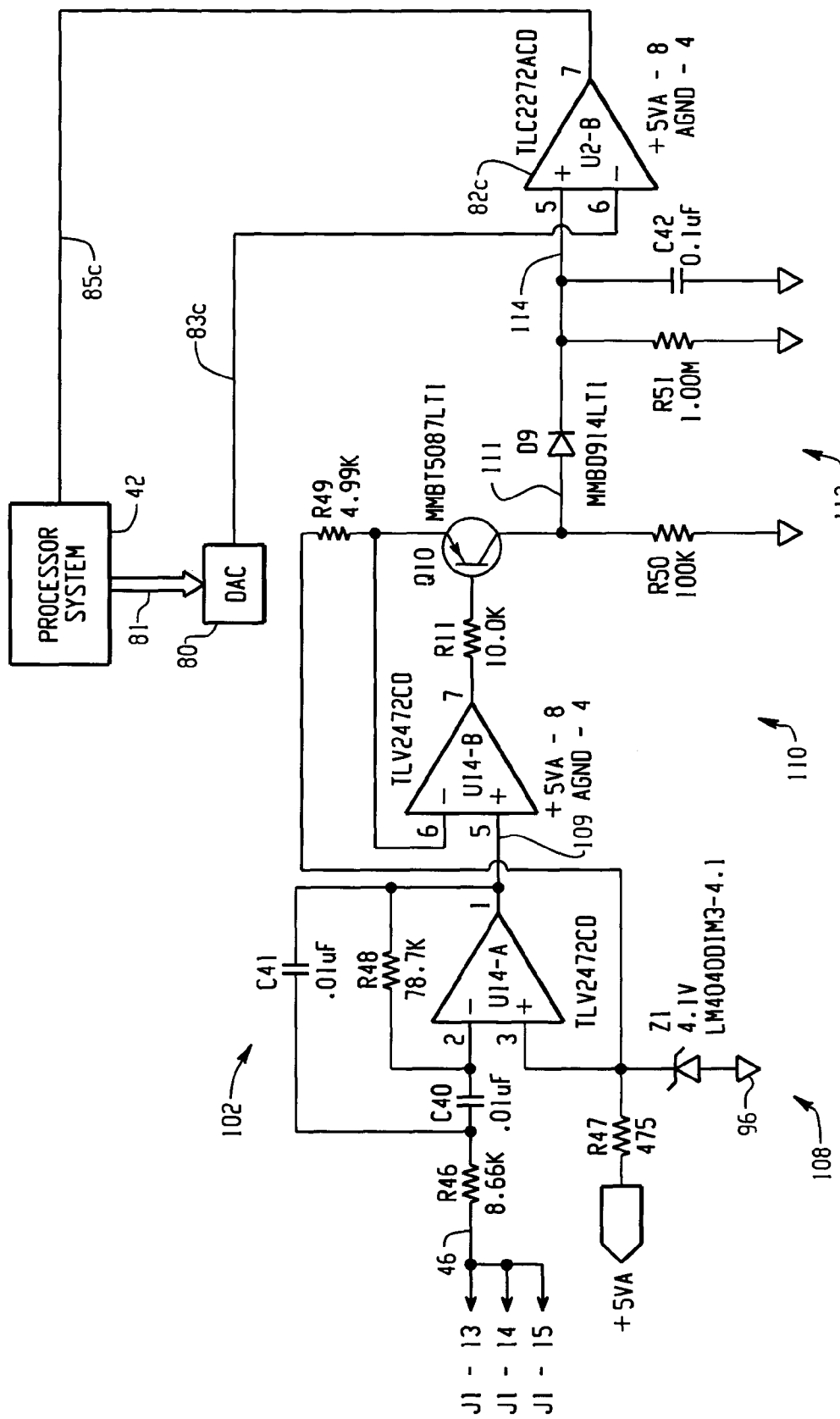
FIG. 4B is a schematic block diagram showing more detail about one implementation of a diode ripple test circuit of the starting/charging system tester according to the present invention.

Referring now to FIG. 4B, a schematic block diagram of the diode ripple circuit 102 is shown. As discussed above, in the preferred embodiment, the diode ripple circuit 102 comprises a bandpass filter 108 in circuit communication with a signal conditioning circuit 110, which in turn is in circuit communication with a peak detect circuit 112. The bandpass filter 108 preferably comprises operational amplifier U14-A and associated components—resistor R46, resistor R47, resistor R48, capacitor C40, capacitor C41, and Zener diode Z1—connected as shown. Zener diode Z1 provides a pseudo-ground for the AC signal component of signal 46. The bandpass filter 108 has a gain of approximately 4.5 and has bandpass frequency cutoff values at approximately 450 Hz and 850 Hz. Signal 109 from bandpass filter 108 is then conditioned using signal conditioner 110. Signal conditioner 110 preferably comprises an amplifier U14-B and a transistor Q10 and associated components—resistor R11, resistor R47, resistor R49, resistor R50, and Zener diode Z1—connected as shown. Signal conditioner circuit 110 generates a DC signal 111 corresponding to the amplitude of the AC signal component of signal 46. The resulting signal 111 is then input to peak detector 112, preferably comprising diode D9, resistor R51, and capacitor C42, connected as shown, to generate signal 114. The signal 114 from the peak detect circuit 112 is measured by the processor 42, DAC 80, and comparator 82c using the successive approximation method. This value is compared to a threshold value, preferably by processor 42, to determine if excessive diode ripple is present. An appropriate display is generated by the processor 42. In the alternative, the signal 85c can be input to a discrete display to indicate the presence or absence of excessive diode ripple.

Referring once again to FIG. 2, test circuit 40 further has a battery tester component 117. The battery tester component 117 includes a test current generator circuit 118 and an AC voltage amplifier/converter circuit 119. The battery tester component 117 is preferably implemented using DAC 80 and a comparator 82d, to facilitate the testing of a battery. The test current generator circuit 118 preferably applies a load current to the battery under test. The AC voltage amplifier/converter circuit 119 measures the voltage generated by the load current applied to the battery. The measuring preferably includes amplifying the voltage and converting it to a ground referenced DC voltage.

Figure 4C:
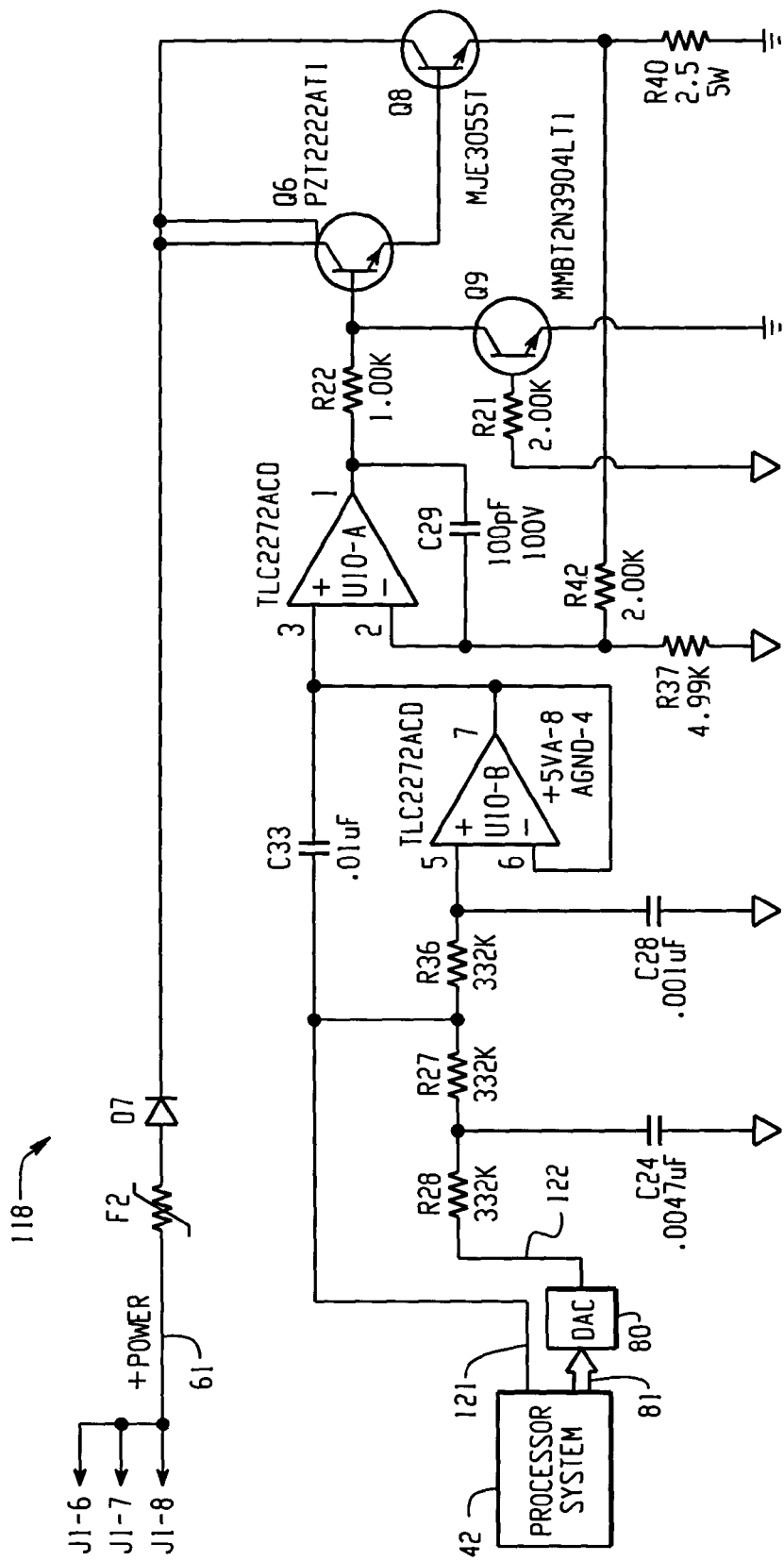
FIG. 4C is a schematic diagram illustrating a test current generator circuit of the battery tester component of the present invention.

In this regard, reference is now made to FIG. 4C where the preferred embodiment of test current generator circuit 118 is illustrated. The circuit 118 includes resistors R21, R22, R27, R28, R36, R37, R40, and R42, capacitors C24, C28, C29, and C33, operational amplifiers U10-A and U10-B, and transistors Q6, Q8, and Q9, all interconnected as shown. In operation, processor 42 and DAC 80 together produce a variable voltage pulse signal that is output on node 122. A filter is formed by resistors R28, R27, R36, capacitors C24 and C28 and amplifier U10-B, which converts the signal on node 122 to a sine wave signal. The sine wave signal is applied to a current circuit formed by amplifier U10-A, R22, C29, Q6, Q8, and R40 arranged in a current sink configuration. More specifically, the sine wave signal is applied to the "+" terminal of amplifier Q10-A. The sine wave output of amplifier of Q10-A drives the base terminal of Q6 which, in turn, drives the base terminal of Q8 to generate or sink a sine wave test current. This causes the sine wave test current to be applied to the battery under test through terminal 61 (+ POWER). It should also be noted that an enable/disable output 121 from processor 42 is provided as in input through resistor R36 to amplifier U10-B. The enable/disable output 121 disables the test current generator circuit 118 at start-up until DAC 80 has been initialized. Also, a surge suppressor F2 and diode D7 are provided to protect the circuitry from excessive voltages and currents. As described above, the test current generates a voltage across the terminals of the battery, which is measured by AC voltage amplifier/converter circuit 119. This AC voltage is indicative of the battery's internal resistance.

Referring now to FIG. 4D, AC voltage amplifier/converter circuit 119 will now be discussed in more detail. The circuit is formed of two amplifier stages and a filter stage. The first amplifier stage is formed by diodes D3 and D5, resistors R30, R31, R32, R33, R34, amplifier U9-A, and zener diode Z5. The second amplifier stage is formed by resistors R9, R24, R25, and R17, capacitor C27, amplifier U9-B, and transistor Q4. The filter stage is formed by resistors R8, R18, R19, capacitors C15, C17, and C19, and amplifier U7-A.

In operation, the AC voltage to be measured appears on node 46 (+SENSE) and is coupled to amplifier U9-A through C32, which removes any DC components. An offset voltage of approximately 1.7 volts is generated by resistors R33 and R34 and diodes D3 and D5. Resistor R32 and zener diode Z5 protect amplifier U9-A against excessive input voltages. The gain of amplifier U9-A is set by resistors R30 and R31 and is approximately 100. Hence, the amplified battery test voltage is output from amplifier U9-A to the second amplifier stage.

More specifically, the amplified battery test voltage is input through capacitor C27 to amplifier U9-B. Capacitor C27 blocks any DC signal components from passing through to amplifier U9-B. Resistors R9 and R25 and zener diode Z3 bias amplifier U9-B. Coupled between the output and (−) input of amplifier U9-B is the emitter-base junction of transistor Q4. The collector of Q4 is coupled to the ground bus through resistor R17. In essence, the second amplifier stage rectifies the decoupled AC signal using amplifier U9-B and transistor Q4 to invert only those portions of the decoupled AC signal below approximately 4.1 volts and referencing the resulting inverted AC signal, which appears across R17, to the potential of the ground bus. The resulting AC signal is provided downstream to the filter stage.

Input to the filter stage is provided through a resistor-capacitor networked formed by resistors R18, R19, and R8, and capacitors C17 and C19. Amplifier U7-A and feedback capacitor C15 convert the AC input signal at the (+) input of the amplifier U7-A to a DC voltage that is output to node 120. Node 120 provides the DC voltage as an input to the (−) terminal of comparator 82d. The (+) terminal of comparator 82d receives the output of DAC 80 on node 83d. The output of comparator 82d is a node 85d that is in circuit communication with an data input on processor 42. Through DAC 80 and comparator 82d, processor can use a successive approximation technique to determine the amplitude of the DC voltage on node 120 and, therefore, ultimately the internal resistance of the battery under test. This internal resistance value, along with user input information such as the battery's cold-cranking ampere (hereinafter CCA) rating, can determine if the battery passes or fails the test. If the battery fails the test, replacement is suggested. Additional battery tester circuitry can be found in the patents listed in the Background.

Figure 5A:
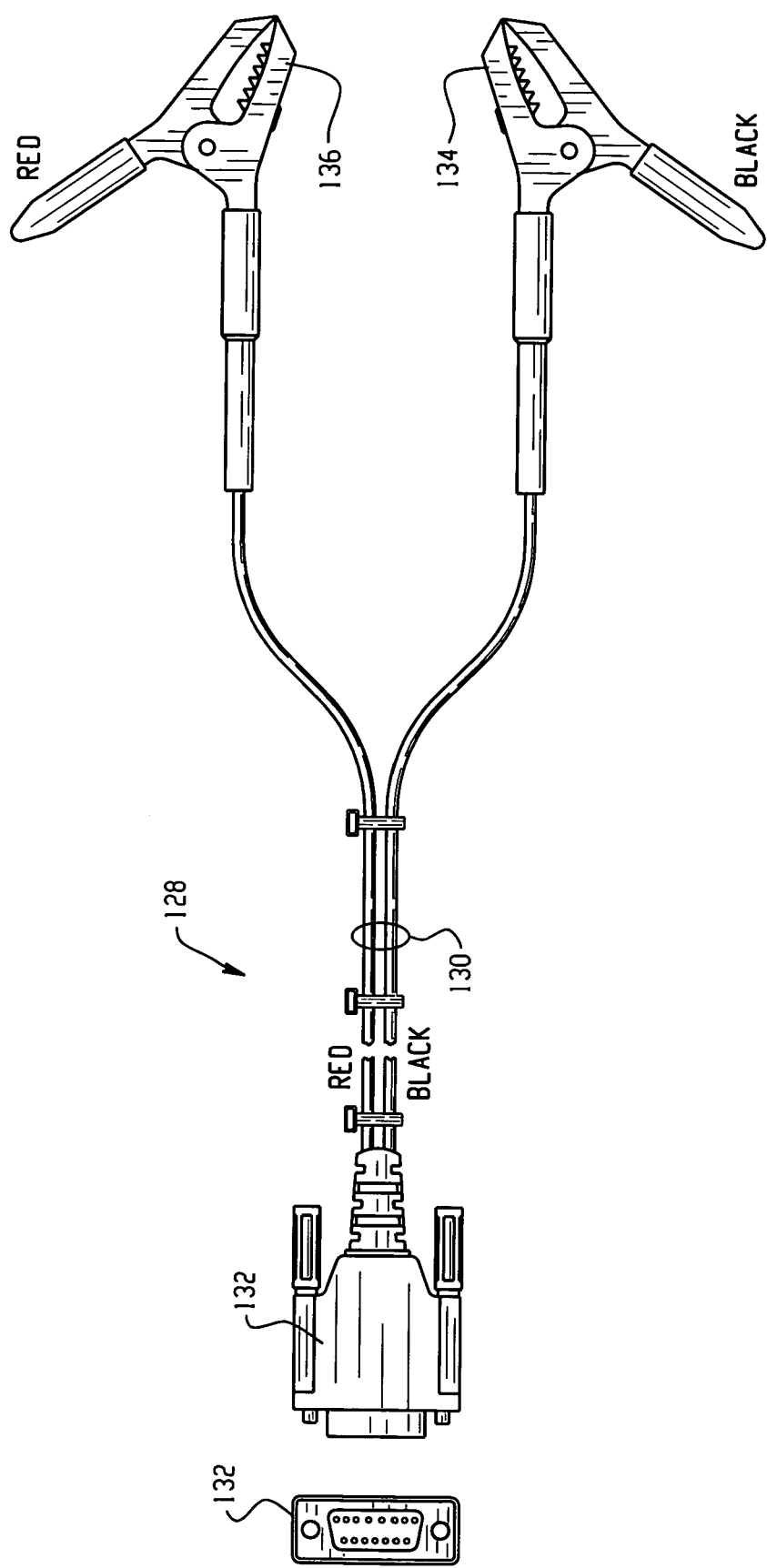
FIG. 5A shows a plan view of one implementation of a clamp cable for the starting/charging system tester according to the present invention.
Figure 5B:
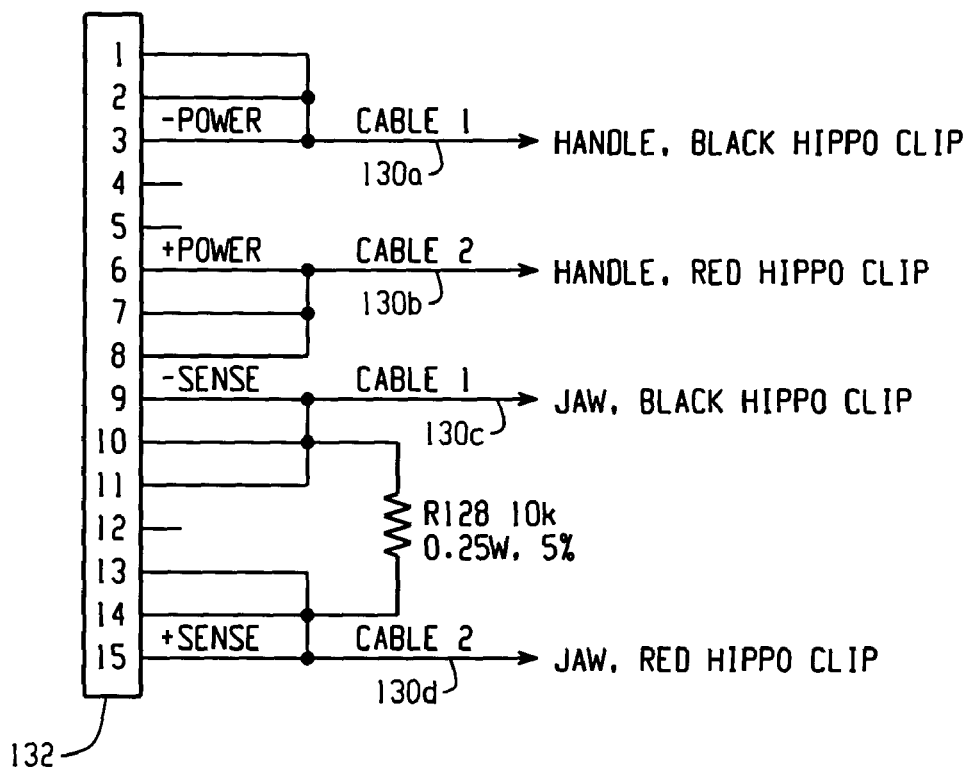
FIG. 5B shows a schematic diagram of connections within the clamp cable of FIG. 5A.
Figure 5C:
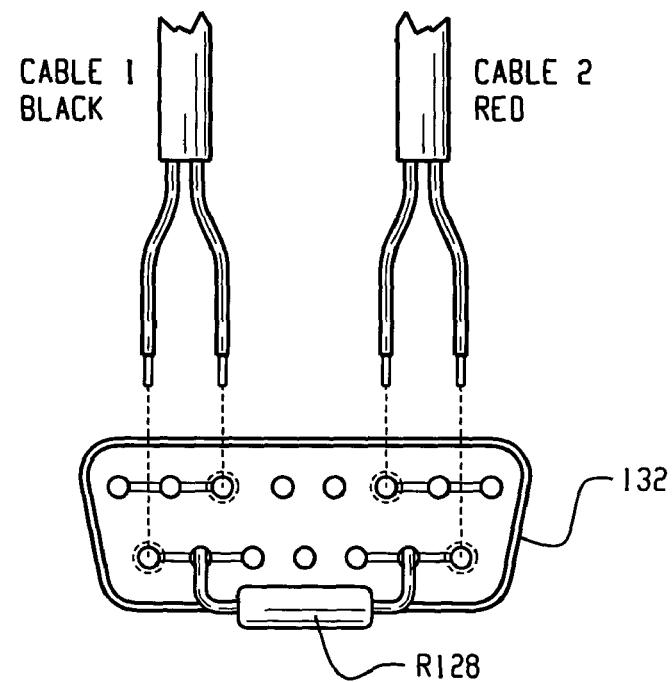
FIG. 5C shows a rear view of the inside of the housing of the clamp cable of FIG. 5A.

Referring now to FIGS. 5A–5C, a two-clamp embodiment 128 of a test cable 28 is shown. The cable 128 of this embodiment preferably comprises a four-conductor cable 130 in circuit communication with a connector 132 at one end, connected as shown in FIGS. 5B and 5C, and in circuit communication with a pair of hippo clips 134, 136 at the other end. The cable 128 is preferably about three (3) feet long, but can be virtually any length. The connector 132 mates with connector J1 of tester 10. The four conductors in cable 130 are preferably connected to the hippo clips 134, 136 so as to form a Kelvin type connection, with one conductor electrically connected to each half of each hippo clip, which is known in the art. In this cable 128, the power ground 94 and signal ground 96 are preferably connected to form a star ground at the negative battery terminal. Resistor R128 connects between the +sense and −sense lines. In test cable 128, pin four (4) is open; therefore, the equivalent circuit of the detection circuit 44 for this cable 128 is found in FIG. 3B. More specifically, with the hippo clips 134, 136 connected to a battery of a starting/charging system 11, and connector 132 connected to mating connector J1 on tester 10, the equivalent circuit of the detection circuit 44 for this cable 128 is found in FIG. 3B. The processor 42 determines the existence of this cable 128 by (i) measuring the battery voltage $V_{BATT}$ using voltmeter 100, (ii) dividing the battery voltage $V_{BATT}$ by ten, and (iii) determining that the voltage at node 92 is above or below a threshold value. In this example the threshold value is determined to be approximately two-thirds of the way between two expected values or, more specifically, $(V_{BATT}/20+V_{BATT}/10.5)/1.5$. If above this value, then cable 128 is connected.

Figure 6A:
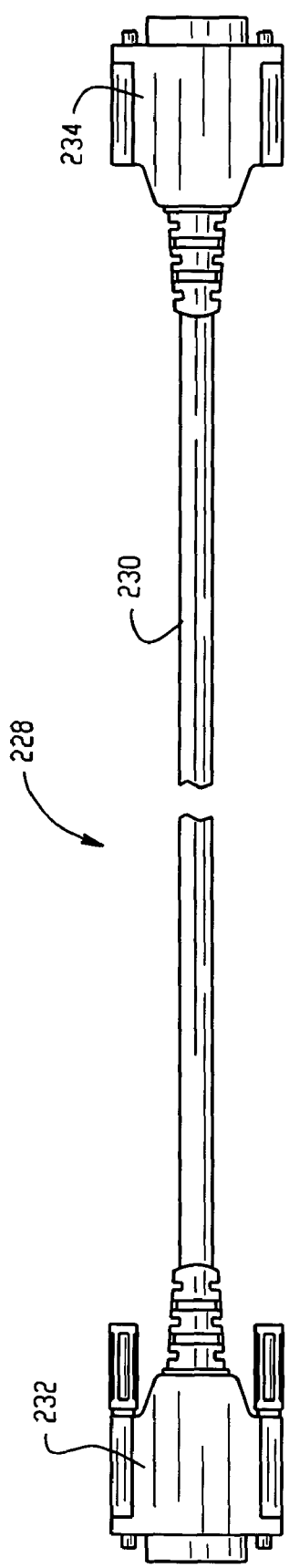
FIG. 6A shows a plan view of one implementation of an extender cable for the starting/charging system tester according to the present invention.
Figure 6B:
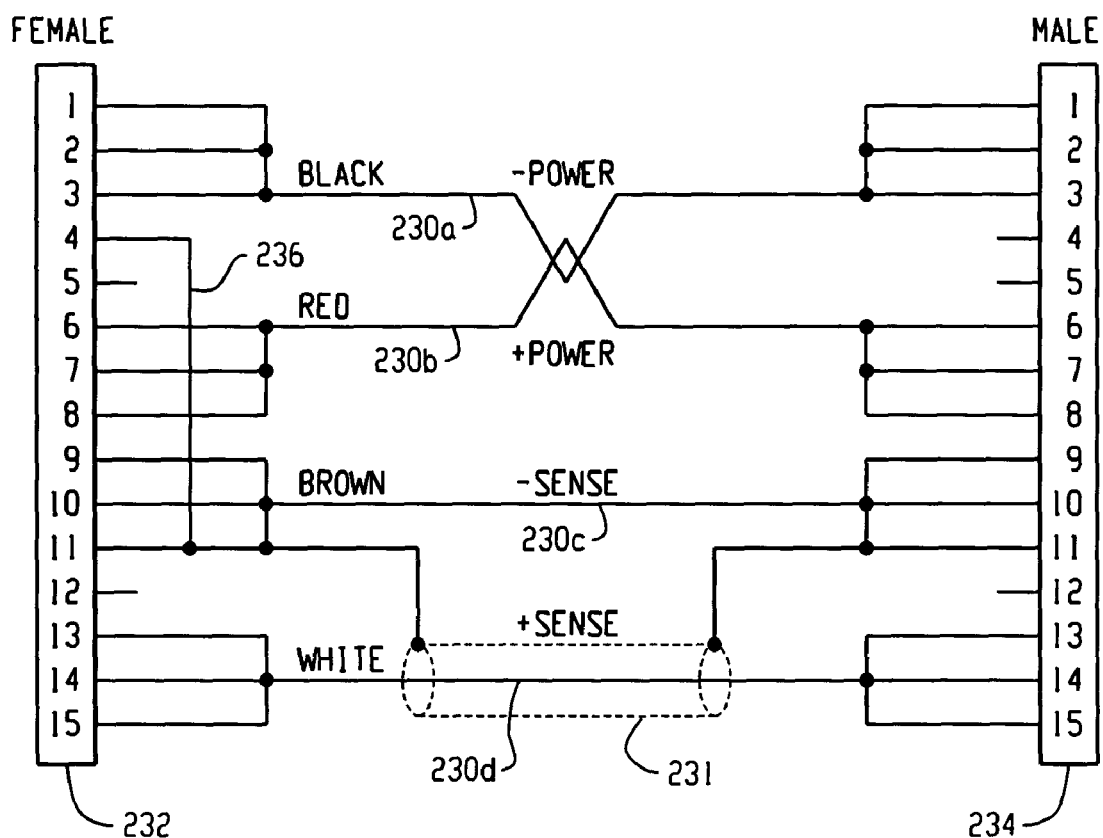
FIG. 6B shows a schematic diagram of connections within the extender cable of FIG. 6A.

Referring now to FIGS. 6A–6B, an embodiment of an extender cable 228 is shown. The cable 228 of this embodiment preferably comprises a four-conductor cable 230 in circuit communication with a first connector 232 at one end and a second connector 234 at the other end, connected as shown in FIG. 6B. The cable 128 is preferably about twelve (12) feet long, but can be virtually any length. Cable conductors 230a and 230b are preferably in a twisted pair configuration. Cable conductor 230d is preferably shielded with grounded shield 231. Connector 232 mates with connector J1 of tester 10. Connector 234 mates with connector 132 of cable 128 of FIGS. 5A–5C (or, e.g., with connector 332 of cable 328 (FIGS. 7A–7C) or with connector 432 of cable 428 (FIG. 8)). In cable 228, the power ground 94 and signal ground 96 are not connected to form a star ground; rather, the extender cable 228 relies on another test cable (e.g., cable 128 or cable 328 or cable 428) to form a star ground. In cable 228, pin four (4) of connector 232 (detection signal 48 in FIG. 3A) is grounded to signal ground 96 (pin eleven (11)) via connection 236; therefore, the equivalent circuit of the detection circuit 44 for this cable 128 is found in FIG. 3C. More specifically, with a cable 128 connected to connector 234, and with the hippo clips 134, 136 of cable 128 connected to a battery of a starting/ charging system 111, and connector 232 connected to mating connector J1 on tester 10, the equivalent circuit of the detection circuit 44 for this cable combination 128/228 is found in FIG. 3C. The processor 42 determines the existence of this cable 128 by (i) measuring the battery voltage $V_{BATT}$ using voltmeter 100, (ii) dividing the battery voltage $V_{BATT}$ by twenty and, (iii) determining that the voltage at node 92 is above or below a threshold value. In this example the threshold value is determined to be approximately two-thirds of the way between two expected values or, more specifically, $(V_{BATT}/20+V_{BATT}/10.5)/1.5$. If below this value, then cable 128 is connected.

In response to detecting an extended cable combination 128/228, the processor 42 may perform one or more steps to compensate the electronics in the test circuit for effects, if any, of adding the significant length of wiring inside cable 228 into the circuit. For example, voltage measurements taken with voltmeter 100 might need to be altered by a few percent using either a fixed calibration value used for all extender cables 228 or a calibration value specific to the specific cable 228 being used. Such a calibration value might take the form of an offset to be added to or subtracted from measurements or a scalar to be multiplied to or divided into measurements. Such alterations could be made to raw measured data or to the data at virtually any point in the test calculations, responsive to determining that the extender cable 228 was being used.

Figure 7A:
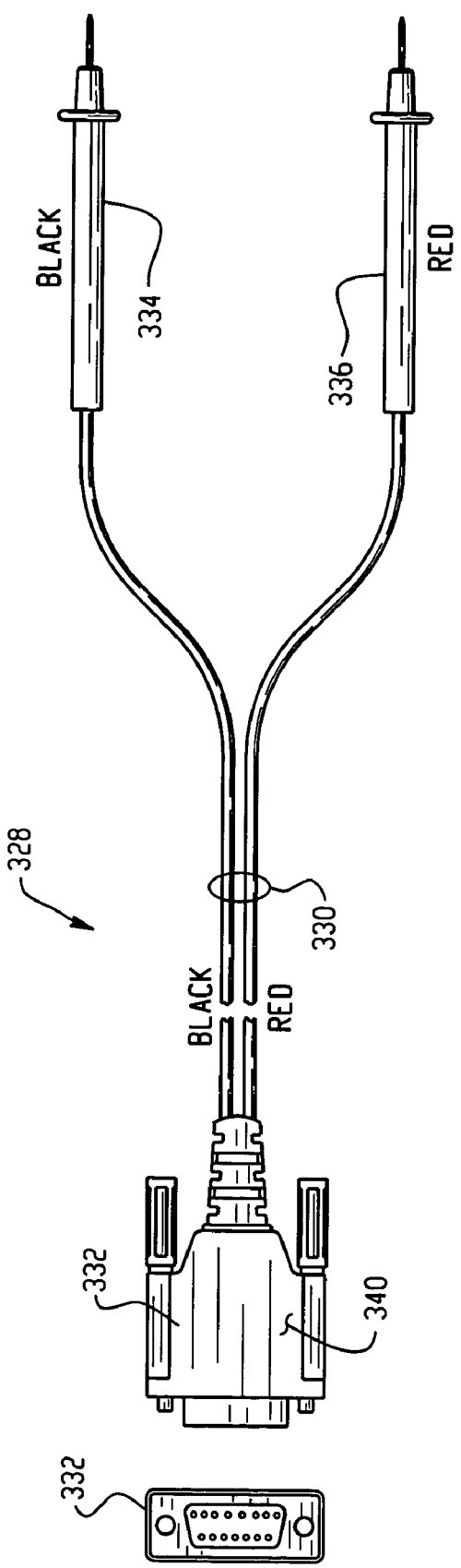
FIG. 7A shows a plan view of one implementation of a probe cable for the starting/charging system tester according to the present invention.
Figure 7B:
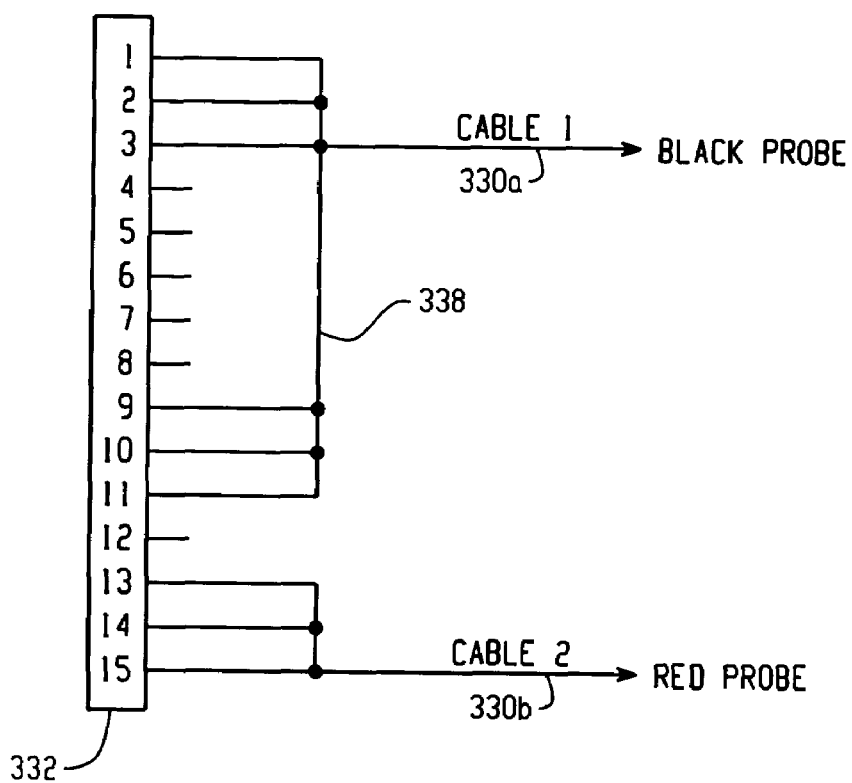
FIG. 7B shows a schematic diagram of connections within the probe cable of FIG. 7A.
Figure 7C:
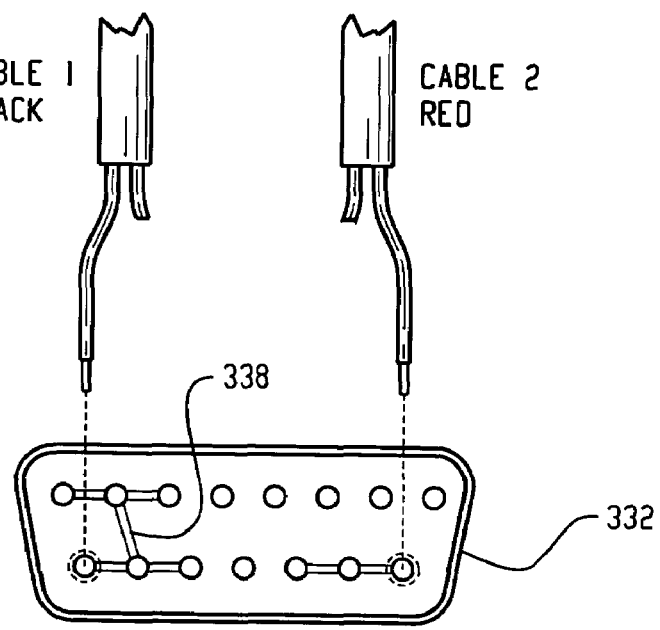
FIG. 7C shows a rear view of the inside of the housing of the probe cable of FIG. 7A.

Referring now to FIGS. 7A–7C, a probe embodiment 328 of a test cable 28 is shown. The cable 328 of this embodiment preferably comprises a two-conductor cable 330 in circuit communication with a connector 332 at one end, connected as shown in FIGS. 7B and 7C, and in circuit communication with a pair of probes 334, 336 at the other end. The cable 328 is preferably about three (3) feet long, but can be virtually any length. The connector 332 mates with connector J1 of tester 10. In this cable 328, the power ground 94 and signal ground 96 are connected by connection 338 inside housing 340 of connector 332 to form a star ground inside housing 340. In cable 328, the battery power signal 48 is open and the detection signal 61 (pin four (4) of connector J1) is open; therefore, the equivalent circuit of the detection circuit 44 for this cable 328 is found in FIG. 3F. More specifically, with connector 332 connected to mating connector J1 on tester 10, the equivalent circuit of the detection circuit 44 for this cable 328 is found in FIG. 3F, i.e., the-voltage at node 92 is at zero volts or at about zero volts. The processor 42 determines the existence of this cable 328 by (i) measuring the battery voltage $V_{BATT}$, (ii) dividing the battery voltage $V_{BATT}$ by a predetermined value such as, for example, ten or twenty, and (iii) determining that the voltage at node 92 is above or below a threshold value.

The power circuit 60 allows the tester 10 to power up using the internal battery 62 when using the cable 328 with probes. More specifically, pressing and holding a particular key, e.g., key 21, causes the internal battery 62 to temporarily power the tester 10. During an initial start-up routine, the processor determines the battery voltage using voltmeter 100 and determines that there is no battery hooked up via power line 61. In response thereto, the processor 42 via control signal 63 causes a switch, e.g., a MOSFET (not shown) in power circuit 60 to close in such a manner that the tester 10 is powered by the internal battery 62 after the key 21 is released.

Referring now to FIG. 8, a block diagram of a proposed sensor cable 428 is shown. Sensor cable 428 is preferably an active, powered device and preferably comprises a four-conductor cable 430, a connector 432, a power supply circuit 434, an identification signal generator 436, a control unit 438, a sensor 440, a pre-amp 442, and a calibration amplifier 446, all in circuit communication as shown in FIG. 8. Connector 432 mates with connector J1 of tester 10. Sensor cable 428 may or may not be powered by a battery being tested and may therefore be powered by the internal battery 62 inside tester 10. Accordingly, sensor cable 428 preferably comprises battery power connections 430a, 430b to the internal battery 62. Power supply circuit 434 preferably comprises a power regulator (not shown) to generate from the voltage of battery 62 the various voltages needed by the circuitry in sensor cable 428. In addition, power supply circuit 434 also preferably performs other functions of known power supplies, such as various protection functions. The sensor cable 428 also preferably comprises an identification signal generator 436 that generates an identification signal 430c that interfaces with detection circuit 44 of tester 10 to provide a unique voltage at node 92 for this particular cable 428. Identification signal generator 436 may, for example, comprise a Zener diode or an active voltage regulator (neither shown) acting as a regulator on the internal battery voltage to provide a particular voltage at 430c, thereby causing the detection circuit to behave as in FIG. 3D, with the voltage at node 92 being about half the voltage generated by identification signal generator 436. In the alternative, another circuit of FIGS. 3B–3F may be used to uniquely identify the sensor cable 428. Sensor cable 428 is preferably controlled by control unit 438, which may be virtually any control unit, e.g., discrete state machines, a preprogrammed processor, etc. Control unit 438 preferably controls and orchestrates the functions performed by sensor cable 428. Sensor cable 428 also preferably comprises a sensor 440, e.g., a Hall effect sensor, in circuit communication with a pre-amp 442, which in turn is in circuit communication with a calibration amplifier 446. Calibration amplifier 446 outputs the signal 430d, which is measured by voltmeter 100. Pre-amp 442 and calibration amplifier 446 may be in circuit communication with control unit 438 to provide variable gain control or automatic gain control to the sensor cable 428. The particular identification signal 430c generated by ID generator 436 can be made to change by control unit 438 depending on a particular gain setting. For example, if the sensor 440 is a Hall effect sensor and the sensor cable 428 implements a current probe, the particular identification signal 430c generated by ID generator 436 can be set to one voltage value for an ampere range of e.g. 0–10 Amperes and set to a different voltage value for an ampere range of e.g. 0–1000 Amperes, thereby specifically identifying each mode for the probe and maximizing the dynamic range of the signal 46 for each application. In this type of system, the processor 42 would need to identify the type of cable attached before each measurement or periodically or in response to user input.

Similarly, the DLC cable 29 (FIG. 1D) preferably uses one of the foregoing identification circuits, or a variation thereof, so that the processor 42 can determine that this cable 29 is connected to the tester 10 via connector J1 by one of the foregoing methods. For example, if the DLC cable 29 uses a variation of the FIG. 3C identification circuit, the processor 42 would detect cable 29 by (i) measuring the battery voltage $V_{BATT}$ using voltmeter 100, (ii) dividing the battery voltage $V_{BATT}$ by a constant determined by the specific resistor values used and, (iii) determining that the voltage at node 92 is above or below a threshold value indicative of the cable 29.

Figure 9:
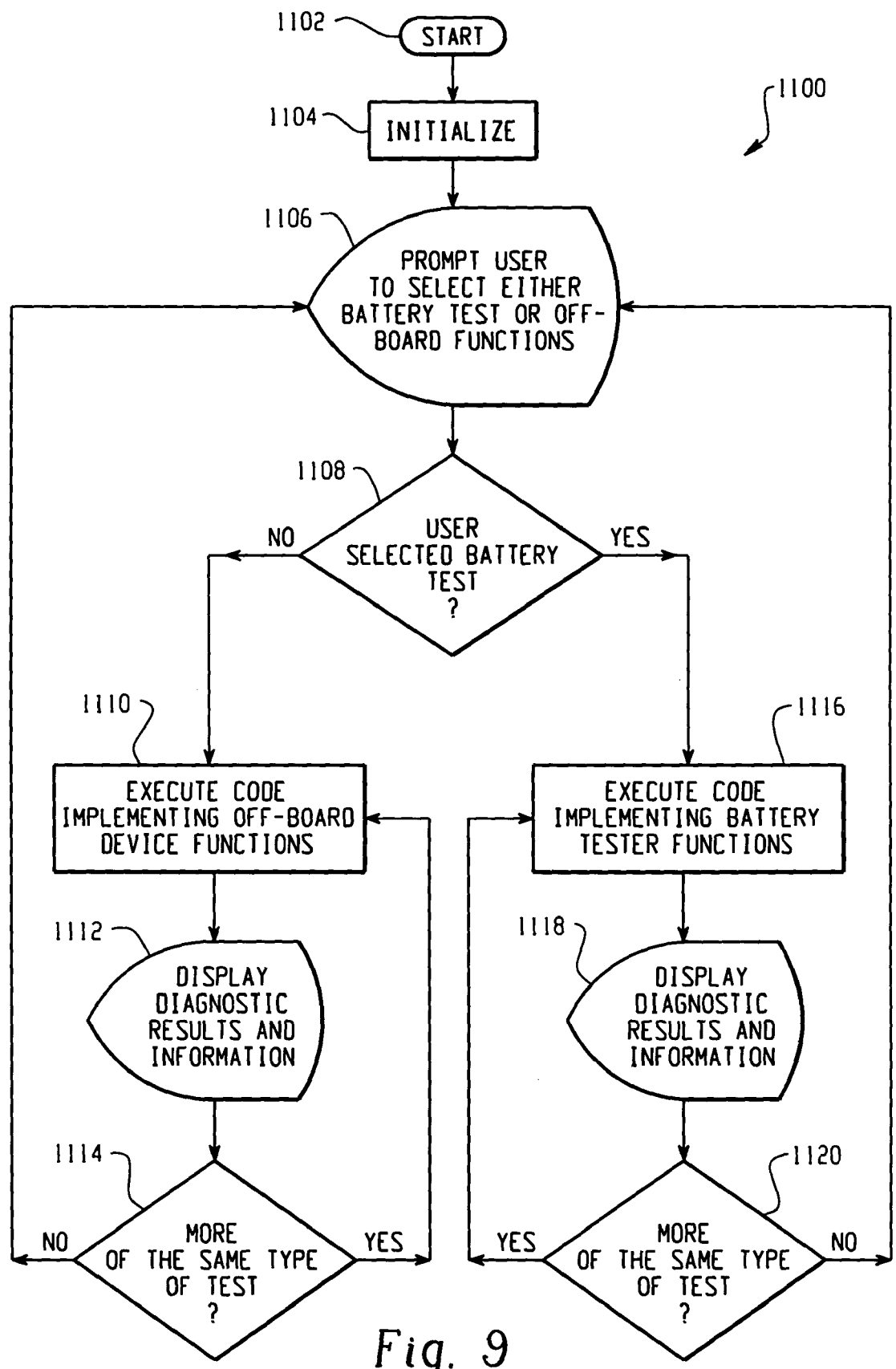
FIG. 9 is a medium level flow chart showing an embodiment of a user selection of the battery test or off-board test function of the present invention.
Figure 10:
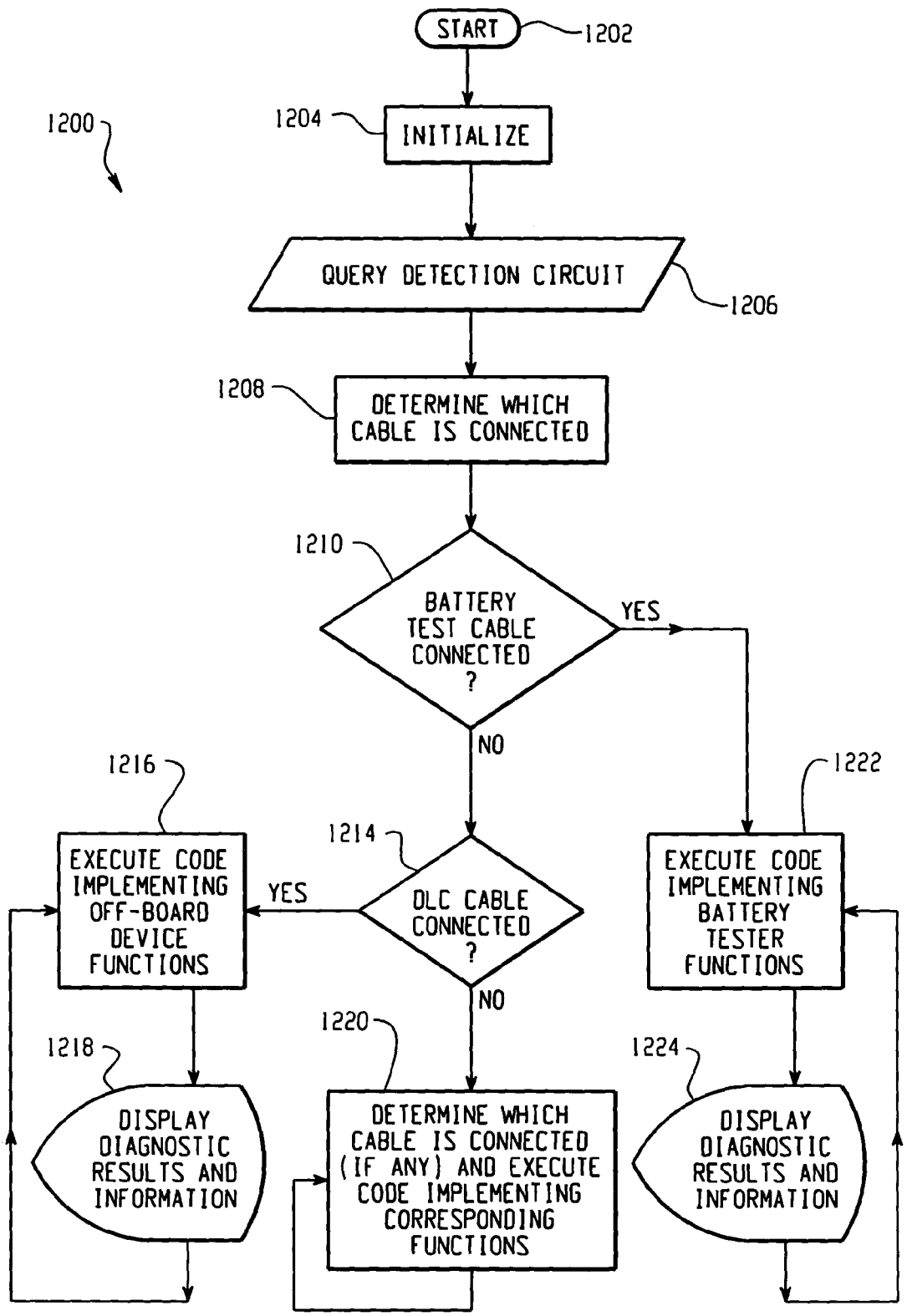
FIG. 10 is a medium level flow chart showing an embodiment of an automatic selection of the battery test or off-board test function of the present invention.

Referring now to FIGS. 9 and 10, in the context of the previous figures, two very high-level flow charts 1100 and 1200 showing the operation of tester 10 are shown. The tasks in the various flow charts are preferably controlled by processor 42, in connection with input from the user and other devices, e.g., the detection circuit 44. Thus, the processor 42 has preferably been preprogrammed with code to implement the various functions described herein. In FIG. 9, the user selects whether the tester is in the off-board device mode (e.g., scan tool mode or code reader mode) or in the battery tester mode (or a mode that tests some other aspect of the vehicle starter/charger system 11. In FIG. 10, the processor and the detection circuitry automatically determine which cable is connected and put the tester 10 into the appropriate mode. FIGS. 9 and 10 are exemplary and are not meant to show the only methods of changing between modes of operation.

Referring first to FIG. 9, starting at task 1102, the user preferably first connects the appropriate cable (e.g., either battery test cable 28 or DLC cable 29) to the tester 10 via connector J1, and connects the selected cable 28, 29 either to the terminals of the battery of the starting/charging system 11 or to the DLC of the vehicle's diagnostic system 13, respectively. Then, the user powers up the tester 10 by pressing the on/off key 18. In the alternative, the tester 10 can automatically power up in response to being connected to the vehicle's battery. In response to the system powering up, the processor 42 initializes the tester 10 at ask 1104, e.g., by performing various self-tests and/or calibrations, such as autozeroing.

Next, at task 1106, the tester 10 prompts the user to select either battery test mode or off-board device mode using the user interface generated by the processor using user input 16. If the user selected off-board device mode, as tested at task 1108, the code branches to task 1110. At tasks 1110 and 1112 the processor 42 executes code causing the tester to implement an off-board device functions and display any results. For example, at tasks 1110 and 1112, the processor 42 might execute code causing the tester 10 to implement a code reader (generating a communications link with one or more computer modules in the vehicle diagnostic system 13 via the vehicle interface 39, reading any diagnostic trouble codes asserted by those modules, and displaying any diagnostic codes on display 24). In the alternative, the processor 42 might execute code causing the tester 10 to implement a scan tool (generating a communications link with one or more computer modules in the vehicle diagnostic system 13 via the vehicle interface 39, reading any diagnostic trouble codes asserted by those modules, and displaying textual diagnoses associated with the diagnostic codes on display 24, plus other major functions that are performed by typical scan tools: "View Data," also known as "Live Data," "Data," and "Data Test, DTC" (viewing and displaying in real-time live, changing data from a plurality of module sensors), display of textual diagnosis descriptions corresponding to the various diagnostic codes, recording and playback of data, device control (manually controlling modules for diagnostic purposes), and reading and displaying vehicle information from the vehicle's computer (e.g., VIN information, controller calibration identification number, etc.)). In addition, scan tools are capable of downloading program code to update any of the computers in the vehicle diagnostic system.

After displaying the diagnostic results the code proceeds to task 1114 where the code causes the processor to prompt the user to select whether or not to perform more of the same type of test, i.e., keep the tester 10 in the same mode. If the user selects "yes" at task 1114 the code loops back to task 1110 and executes the code implementing the Off-Board Device Functions. If, at task 1114, the user selects "no" the code loops back to task 1106 and prompts the user to select either Battery Test function or Off-Board Functions.

If, at task 1108, the user selects the battery test mode, the code branches to task 1116, which causes the processor to cause the tester 10 to implement a battery tester (or a tester of another aspect of the starting/charging system). At tasks 1116 and 1118 the code implements the battery test functions and displays the results of any tests (e.g., estimating and displaying an estimated battery CCA value, measuring and displaying battery open circuit voltage, and determining and displaying whether or not the internal impedance of the battery is higher than acceptable using test current generator 118, AC voltage amplifier/converter 119, DAC 80, and comparator 82d, as discussed above) and/or performs other tests on the starter/charger system, such as the tests discussed in U.S. patent application Ser. No. 09/813,104, which was filed on Mar. 19, 2001, and entitled HANDHELD TESTER FOR STARTING/CHARGING SYSTEMS, which is hereby incorporated by reference in its entirety: (i) the starter test, (ii) the no load, curb idle charger test, (iii) the no load, fast idle charger test, (iv) the high load, fast idle charger test, and/or (v) the diode ripple test. The displayed results are indicative of the condition of the battery and/or the condition of the starter/charger system. The code proceeds to task 1120 and prompts the user to determine whether to perform more of the same test. If the user selects "yes," at task 1120, the code loops back to task 1116 and executes the battery test (or the other tests on the vehicle starter/charger system). If the user selects "no," at task 1120, the code loops back to task 1106 and the user is prompted to select either Battery Test or Off-Board Functions. At this point the user may proceed with another test or power down the Tester.

The example of FIG. 10 is very similar to the example of FIG. 9, except that the tester 10 automatically determines whether the battery test cable 28 or the DLC cable 29 is attached to the tester 10 via connector J1, and automatically places the tester 10 into either the battery tester mode (if the battery test cable 28 is detected) or the off-board device mode (if the DLC cable 29 is detected).

Referring now to FIG. 10, starting at task 1202, the user preferably first connects the appropriate cable (e.g., either battery test cable 28 or DLC cable 29 ) to the tester 10 via connector J1, and connects the other end of the selected cable 28, 29 either to the terminals of the battery of the starting/charging system 11 or to the DLC of the vehicle's diagnostic system 13, respectively. Then, the user powers up the tester 10 by pressing the on/off key 18. In the alternative, the tester 10 can automatically power up in response to being connected to the vehicle's battery. In response to the system powering up, the processor 42 initializes the tester 10 at ask 1204, e.g., by performing various self-tests and/or calibrations, such as autozeroing.

Next, at task 1206, the processor queries the detection circuit to determine which cable 28, 29 is connected to the tester 10 via connector J1, and determines which cable 28, 29 is connected, at 1208. As discussed above, in general, this can be done by having the processor 42 measure the voltage at node 92 using a successive approximation technique with DAC 80 and comparator 82a, comparing the measured value of the voltage at node 92 to a plurality of voltage values, and selecting a cable type based on the measured voltage relative to the predetermined voltage values. One or more of the plurality of voltage values may depend on, or be a function of, battery voltage; therefore, the processor may measure the battery voltage and perform various computations thereon as part of determining the plurality of voltage values such as, for example, those described in connection with FIGS. 5A–7B, above.

The code proceeds to task 1210 and determines whether the battery test cable 28 is connected. If the battery test cable 28 is connected, the code branches to task 1222 and 1224, which causes the processor 42 to cause the tester 10 to implement a battery tester (or starter/charger system tester) and generate corresponding displays, as discussed above in connection with tasks 1116 and 1118. After displaying the diagnostic information at task 1224, the code loops back to task 1222 and is ready to implement additional tests of the battery or the starter/charger system.

If the battery test cable 28 is not connected at task 1210 the code proceeds to task 1214 and determines if the DLC cable 29 is connected to the tester 10 via connector J1. If the DLC cable 29 is connected, the code at task 1216 implements the off-board device functions and generates a corresponding display, at 1218, as discussed in connection with tasks 1110 and 1112, above. Following the display of the diagnostic information the code loops back to task 1216 and the tester 10 is ready to implement additional off-board testing functions.

If, at task 1214, the code does not detect the DLC cable the code proceeds to task 1220. At task 1220 the code, again attempts to determine which cable, if any, is connected and implements the function, if any, that corresponds to the cable connected. If no function is associated with the detected cable, an error message is displayed on display 24.

As mentioned above, FIGS. 9 and 10 are exemplary and are not meant to show the only methods of changing between modes of operation. For example, the detection circuitry is preferably periodically polled by the processor so that if the user "hot-swaps" one cable 28, 29 for the other cable 29, 28, the tester will detect the change in real-time and place the tester 10 in the mode corresponding to the newly connected cable 28, 29. Also, the order of the steps in the examples described above, is not meant to imply that the steps need be performed in that order.

While the present invention has been illustrated by the description of embodiments thereof, and while the embodiments have been described in some detail, it is not the intention of the applicant to restrict or in any way limit the scope of the appended claims to such detail. Additional advantages and modifications will readily appear to those skilled in the art. For example, the housing connector J1 can be replaced with a number of discrete connections, e.g., a number of so-called "banana plug" receptors, preferably with at least one of the discrete connections providing a signal to the detection circuitry. As another example, although specific circuitry has been shown for the battery test mode, the present invention is intended to encompass virtually any battery testing circuitry (including but not limited to the battery testers discussed in the Background above) in combination with circuitry implementing an off-board device. As yet another example, although the two modes of operation (battery test mode and off-board device mode) are shown as being used in the alternative, it is also contemplated by the present invention that both cables 28, 29 be used at the same time so that the tester 10 can operate in both modes simultaneously, e.g., by adding battery voltage and/or condition information and/or starting/charging information to a display of off-board device data, e.g., while displaying live data. Therefore, the invention in its broader aspects is not limited to the specific details, representative apparatus and methods, and illustrative examples shown and described. Accordingly, departures may be made from such details without departing from the spirit or scope of the applicant's general inventive concept.

I claim:

1. A handheld portable testing device for interfacing with a vehicle diagnostic system and performing diagnostic tests on a vehicle starter/charging system comprising:
   housing configured to at least partially retain:
      a) a processor,
      b) test circuitry configured to selectively communicate with the starter/charging system to test a starter, a charger and a battery via a test cable,
      c) vehicle interface circuitry configured to selectively communicate with the vehicle diagnostic system via a diagnostic cable to retrieve diagnostic data, and
      d) an output device for displaying the results of the test for the starter, the charger and the battery and for displaying the vehicle diagnostic data, and
      wherein the processor is in circuit communication with test circuitry, vehicle interface circuitry and the output device.

2. The handheld portable testing device of claim 1 wherein the test circuitry is capable of performing a plurality of tests on the starting/charging system.

3. The handheld portable testing device of claim 1 wherein the test circuitry is capable of performing a diagnostic test on a battery.

4. The handheld portable testing device of claim 1 wherein the test circuitry is capable of performing at least one test on a starting unit of the starting/charging system; a plurality of tests on a charging unit of the starting/charging system, at least one of said tests on the charging unit of the starting/charging system being a diode ripple test.

5. The handheld portable testing device of claim 1 wherein the vehicle interface circuitry is capable of retrieving at least one bit of vehicle diagnostic data.

6. The handheld portable testing device of claim 1 wherein the vehicle interface circuitry is capable of downloading program code to update a computer in the vehicle diagnostic system.

7. The handheld portable testing device of claim 1 further comprising a memory interface port in circuit communication with the processor configured to receive a memory expansion card.

8. The handheld portable testing device of claim 1 further comprising an input device in circuit communication with the processor capable of allowing a user to select at least one of a starter/charger test and to retrieve at least one bit of vehicle diagnostic data.

9. The handheld portable testing device of claim 8 wherein the input device is further capable of allowing a user to select a battery rating for testing a battery.

10. A handheld portable testing device for interfacing with a vehicle diagnostic system and performing diagnostic tests on a vehicle starter/charging system comprising:
    housing configured to at least partially retain:
       a) a processor,
       b) test circuitry configured to selectively communicate with the starter/charging system to test at least one of a starter, a charger and a battery via a test cable,
       c) vehicle interface circuitry configured to selectively communicate with the vehicle diagnostic system via a diagnostic cable to retrieve diagnostic data, and
       d) an output device for displaying the results of the test for at least one of the starter, the charger and the battery and for displaying the vehicle diagnostic data, and wherein the processor is in circuit communication with test circuitry, vehicle interface circuitry and the output device; and further comprising a connector with a plurality of electrical connections, in circuit communication with the processor, configured to releasably couple to any one of the test cable, the diagnostic cable and a probe cable.

11. The handheld portable testing device of claim 10 wherein the connector is affixed to the housing.

12. The handheld portable testing device of claim 10 further comprising detection circuitry capable of automatically detecting one of a plurality of types of cables that are connected to the connector.

13. The handheld portable testing device of claim 12 wherein said detection circuitry is capable automatic identification of one of the plurality of types of cables by detection of at least two of the plurality of electrical connections being essentially open circuited.

14. The handheld portable testing device of claim 12 wherein said detection circuitry is capable of automatic identification of one of the plurality of types of cables by detection of at least one electrical resistance placed in circuit communication between two or more of the plurality of electrical connections.

15. A method of testing a starter/charger system and retrieving vehicle diagnostic information with a handheld portable tester comprising:

placing the handheld portable tester in circuit communication with the starter/charger system via a test cable, obtaining information indicative of the condition of a battery, a charger, and a starter, displaying information indicative of the condition of the battery, the charger, and the starter, removing the handheld portable tester from circuit communications with the starter/charger system, placing the handheld portable tester in circuit communication with the vehicle diagnostic system via a diagnostic cable, retrieving data from the vehicle diagnostic system indicative of at least one parameter of the vehicle, displaying the data from the vehicle diagnostic system indicative of the at least one parameter of the vehicle; and removing the portable handheld tester from the circuit communication with the vehicle diagnostic system.

16. The method of testing a starter/charger system and retrieving vehicle diagnostic information with a handheld portable tester of claim 15 wherein placing the handheld testing device in circuit communication with the starter/charger system includes releasably coupling a connector on a first end of the test cable to a housing connector on the handheld testing device, connecting one of two clips on a second end of the test cable to a first point on the positive side of the battery, and connecting a second of two clips on the second end of the test cable to a second point on the negative side of the battery.

17. The method of testing a starter/charger system and retrieving vehicle diagnostic information with a handheld portable tester of claim 15 wherein placing the handheld testing device in circuit communication with the vehicle diagnostic system comprises releasably coupling a connector on a first end of the diagnostic cable to a housing connector on the handheld testing device, and releasably coupling a second connector on a second end of the diagnostic cable to an existing vehicle connector in circuit communication with the vehicle diagnostic system.

18. The method of testing a starter/charger system and retrieving vehicle diagnostic information with a handheld portable tester of claim 15 further comprising displaying the diagnostic information relating to the condition of the battery, the starter and the charge simultaneously with the data indicative of the at least one parameter of the vehicle.

19. A handheld diagnostic device for obtaining information indicative of the condition of a vehicle starter/charging system and obtaining information from a vehicle diagnostic system comprising:

a portable enclosure, means for testing a battery, a starter motor, and an alternator, means for retrieving data from the vehicle diagnostic system comprising a diagnostic cable with a connector for releasably coupling to the vehicle diagnostic system placing the handheld device in circuit communications with the vehicle diagnostic system, a display configured to provide an output for the results of the test of the at least one of the battery; the starter motor and the alternator, and to provide an output for the data retrieved from the vehicle diagnostic system, an input device, and detection circuitry for automatically detecting the type of cable connected to the handheld diagnostic device.

20. The handheld diagnostic device of claim 19 wherein the means for testing the battery, the starter motor, and the alternator further comprises a Kelvin type connector for placing the handheld diagnostic device in circuit communication with a positive battery terminal and a negative battery terminal.

21. The handheld diagnostic device of claim 20 further comprising detection circuitry for automatically detecting the type of cable connected to the handheld diagnostic device.

22. The handheld diagnostic device of claim 21 wherein the means for testing a battery, a starter motor, and an alternator further comprises programming code to automatically test at least one of the battery, the starter, and the alternator upon detecting the type of cable connected to the handheld diagnostic device and the handheld diagnostic device being in circuit communication with a positive battery terminal and a negative battery terminal.

23. The handheld diagnostic device of claim 19 wherein the means for testing the battery, the starter motor, and the alternator further comprises inputting a parameter indicative of a battery rating.

24. The handheld diagnostic device of claim 19 wherein the means for retrieving data from a vehicle diagnostic system comprises programming code to automatically retrieve the diagnostic information upon detecting the type of cable connected to the handheld diagnostic device and being placed in circuit communication with the vehicle diagnostic system.

25. A handheld portable testing device for interfacing with a vehicle diagnostic system and performing diagnostic tests on a vehicle starter/charging system comprising:

housing configured to at least partially retain:
 a) a processor,
 b) test circuitry configured to selectively communicate with the starter/charging system to test a charging system, c) vehicle interface circuitry configured to selectively communicate with the vehicle diagnostic system via a diagnostic cable to retrieve diagnostic data, and d) an output device for displaying the results of the charging system test and for displaying the vehicle diagnostic data, wherein the processor is in circuit communication with test circuitry, vehicle interface circuitry and the output device.

26. A handheld portable testing device for interfacing with a vehicle diagnostic system and performing diagnostic tests on a vehicle starter/charging system comprising:

housing configured to at least partially retain:
a) a processor,
b) test circuitry configured to selectively communicate with the starter/charging system to test a starter,
c) vehicle interface circuitry configured to selectively communicate with the vehicle diagnostic system via a diagnostic cable to retrieve diagnostic data, and
d) an output device for displaying the results of the starter test and for displaying the vehicle diagnostic data, wherein the processor is in circuit communication with test circuitry, vehicle interface circuitry and the output device.

* * * * *